(12) United States Patent
Kaneko et al.

(10) Patent No.: US 6,751,242 B2
(45) Date of Patent: Jun. 15, 2004

(54) SURFACE EMITTING SEMICONDUCTOR LASER AND SURFACE EMITTING SEMICONDUCTOR LASER ARRAY

(75) Inventors: Tsuyoshi Kaneko, Shimosuwa-machi (JP); Takayuki Kondo, Suwa (JP); Tetsuo Nishida, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/740,850

(22) Filed: Dec. 21, 2000

(65) Prior Publication Data

US 2001/0026567 A1 Oct. 4, 2001

(30) Foreign Application Priority Data

Dec. 28, 1999 (JP) ............................................. 11-374785

(51) Int. Cl.[7] ................................................. H01S 5/00
(52) U.S. Cl. ............................................. 372/43; 372/27
(58) Field of Search ..................................... 372/43, 27

(56) References Cited

U.S. PATENT DOCUMENTS

| | | | | |
|---|---|---|---|---|
| 5,394,423 A | * | 2/1995 | Kasahara | 372/45 |
| 5,621,750 A | * | 4/1997 | Iwano et al. | 372/46 |
| 5,703,861 A | * | 12/1997 | Matsuda | 369/103 |
| 5,719,846 A | * | 2/1998 | Matoba et al. | 359/291 |
| 5,783,844 A | | 7/1998 | Kobayashi et al. | |

FOREIGN PATENT DOCUMENTS

| | | |
|---|---|---|
| EP | 0 704 913 A2 | 4/1996 |
| EP | 0 790 682 A1 | 8/1997 |
| EP | 0 935 321 A1 | 8/1999 |
| JP | 6-224515 | 8/1994 |
| JP | 8-116130 | 5/1996 |
| JP | A 11-330630 | 11/1999 |

* cited by examiner

*Primary Examiner*—Paul Ip
*Assistant Examiner*—Delma R. Flores Ruiz
(74) *Attorney, Agent, or Firm*—Oliff & Berridge, PLC

(57) ABSTRACT

A surface emitting semiconductor laser capable of controlling the polarization direction of laser light and a surface emitting semiconductor laser array. In a surface emitting semiconductor laser, a resonator is formed on a semiconductor substrate in the perpendicular direction, from which light is emitted in the direction perpendicular to the semiconductor substrate. The surface emitting semiconductor laser includes a columnar portion, which is part of the resonator, and an insulating layer formed in contact with the side of the columnar portion, wherein the insulating layer exhibits anisotropic stress caused by the planar configuration thereof, and the polarization direction of laser light is controlled by the anisotropic stress.

14 Claims, 18 Drawing Sheets

SURFACE EMITTING SEMICONDUCTOR LASER AND SURFACE EMITTING SEMICONDUCTOR LASER ARRAY

BACKGROUND OF THE INVENTION

1. Field of the Invention

The present invention relates to a surface emitting semiconductor laser which emits laser light in the direction perpendicular to a semiconductor substrate and a surface emitting semiconductor laser array using the surface emitting semiconductor laser.

2. Description of Related Art

A surface emitting semiconductor laser emits laser light in the direction perpendicular to a semiconductor substrate on which a resonator is formed in the perpendicular direction. The resonator causes laser oscillation to occur and emits laser light. The resonator is formed by depositing a reflection layer, an active layer, and a reflection layer, in that order, on the semiconductor substrate.

The surface emitting semiconductor laser has various excellent characteristics. Specifically, the surface emitting semiconductor laser can be easily arrayed (a plurality of lasers are arranged on one semiconductor substrate), has a small threshold, has a stable oscillation wavelength, exhibits an isotropic, small radiation angle in comparison with edge emitting lasers, and the like. Therefore, as a two-dimensionally integratable semiconductor laser, application of the surface emitting semiconductor laser to parallel optical communications, parallel optical arithmetic, laser beam printers, and the like has been expected.

In the case of forming optical devices using a semiconductor laser, devices such as a polarizer or a beam splitter are often used. The reflectivity of the polarizer and beam splitter are dependent on the polarization direction. In the case of using a semiconductor laser assembled into optical devices, if the polarization direction of laser light is insufficiently controlled, problems occur such as changes in the light intensity depending on the polarization direction. Therefore, it is important to control the polarization direction of laser light.

However, since the angle of radiation of laser light emitted from the resonator is isotropic because of the isotropic structure thereof, it is difficult to control the polarization direction of laser light. To deal with this problem, attempts to control the polarization direction of laser light in the surface emitting semiconductor laser has been made. For example, Japanese Patent Applications Laid-open No. 8-116130 and No. 6-224515 disclose technologies for controlling the polarization direction of laser light in the surface emitting semiconductor laser.

SUMMARY OF THE INVENTION

An object of the present invention is to provide a surface emitting semiconductor laser capable of controlling the polarization direction of laser light and a surface emitting semiconductor laser array.

According to the present invention, a surface emitting semiconductor laser in which a resonator is formed on a semiconductor substrate in the perpendicular direction, from which laser light is emitted in the direction perpendicular to the semiconductor substrate, comprises:

a columnar semiconductor deposit which comprises at least part of the resonator; and an insulating layer formed in contact with the side of the semiconductor deposit;

wherein the insulating layer exhibits anisotropic stress caused by the planar configuration thereof, and the polarization direction of laser light is controlled by the anisotropic stress.

The anisotropic stress caused by the planar configuration means stresses which are anisotropic and induced by the planar configuration of the insulating layer. The anisotropic stress includes stresses in the directions intersecting at right angles in different amounts.

According to this surface emitting semiconductor laser, the anisotropic stress can be directly applied to an active layer included in the semiconductor deposit from the insulating layer. Specifically, since the insulating layer exhibits anisotropic stress caused by the planar configuration thereof, the anisotropic stress is applied to the active layer which is in contact with the insulating layer, thereby providing the gain of laser light with anisotropy. As a result, laser light in the specific polarization direction can be preferentially amplified, whereby the polarization direction of laser light can be controlled in a specific direction.

In the surface emitting semiconductor laser according the present invention, assuming that the axes intersecting at right angles through the center of the upper side of the semiconductor deposit are respectively the x-axis and y-axis, the anisotropic stress preferably includes stresses in the x-axial direction and the y-axial direction in different amounts.

According to the surface emitting semiconductor laser having the above configuration, since the anisotropic stress includes stresses in the x-axial direction and the y-axial direction in different amounts, the gain of laser light in the direction perpendicular to the direction in which the amount of stress is the greatest of the x-axial direction and y-axial direction becomes preferential, whereby laser light polarized in the direction perpendicular to the direction in which the amount of stress is greater can be obtained. Therefore, the polarization direction of laser light can be controlled. In addition, since the planar configuration of the insulating layer can be easily adjusted in the layer forming step, the polarization direction can be easily controlled. Moreover, in the case of fabricating a laser array, laser light with uniform characteristics can be obtained.

The following (1) to (4) can be given as embodiments of the insulating layer exhibiting anisotropic stress caused by the planar configuration thereof.

(1) Assuming that the axes intersecting at right angles through the center of the upper side of the semiconductor deposit are respectively the x-axis and y-axis, the planar configuration of the insulating layer may be designed so that the distance between the center and the first intersection point between the x-axis and the side of the insulating layer differs from the distance between the center and the second intersection point between the y-axis and the side of the insulating layer.

Since the planar configuration of the insulating layer is designed so that the distance between the center and the first intersection point between the x-axis and the side of the insulating layer differs from the distance between the center and the second intersection point between the y-axis and the side of the insulating layer, the stress applied to the active layer in the semiconductor deposit from the insulating layer exhibits anisotropy. As a result, the gain of laser light in the direction perpendicular to the direction in which the amount of stress is the greatest of the x-axial direction and y-axial direction becomes preferential, whereby laser light polarized in the direction perpendicular to the direction in which the amount of stress is greater can be obtained. Therefore, the polarization direction of laser light can be controlled.

According to a preferable embodiment of the surface emitting semiconductor laser, a surface emitting semiconductor laser in which a resonator is formed on a semiconductor substrate in the perpendicular direction, from which laser light is emitted in the direction perpendicular to the semiconductor substrate, comprises:

a columnar semiconductor deposit which comprises at least part of the resonator; and an insulating layer formed in contact with the side of the semiconductor deposit;

wherein, assuming that the axes intersecting at right angles through the center of the upper side of the semiconductor deposit are respectively the x-axis and y-axis, the planar configuration of the insulating layer is designed so that the distance between the center and the first intersection point between the x-axis and the side of the insulating layer differs from the distance between the center and the second intersection point between the y-axis and the side of the insulating layer.

According to this surface emitting semiconductor laser, the above-described effects can be achieved.

(2) The planar configuration of the insulating layer may be symmetrical with regard to at least either the x-axis or y-axis.

In the surface emitting semiconductor laser, since the planar configuration of the insulating layer is symmetrical with regard to at least either the x-axis or y-axis, the stress applied to one side of the active layer in the semiconductor deposit and the stress applied to the other side symmetrical with regard to the symmetry axis among the x-axis and y-axis are equivalent and face 180 degrees in opposite directions. Therefore, anisotropy of the stress in the direction parallel to the axis intersecting the symmetry axis at right angles can be further increased. Moreover, polarization of laser light in the direction parallel to the axis intersecting the symmetry axis at right angles can be strictly controlled.

(3) The planar configuration of the insulating layer may be two-fold rotationally symmetrical around the semiconductor deposit.

Two-fold rotational symmetry means that the planar configuration of the insulating layer rotated around the semiconductor deposit at 180 degrees coincides with the original planar configuration of the insulating layer (one-fold is 90 degrees).

In the surface emitting semiconductor laser, since the planar configuration of the insulating layer is two-fold rotationally symmetrical around the semiconductor deposits the stress applied to one side of the active layer in the semiconductor deposit and the stress applied to the other side of the active layer are equivalent and face 180 degrees in opposite directions. Therefore, anisotropy of the stress in the direction parallel to the axis intersecting the above axis can be further increased. Because of this, the polarization direction of laser light can be controlled more strictly.

(4) The insulating layer may be embedded.

In the surface emitting semiconductor laser in which the insulating layer is embedded, since the anisotropic stress occuring in the insulating layer can be applied to the entire area of the semiconductor deposit including the active layer through the side of the semiconductor deposit, whereby polarization of laser light can be securely controlled.

In the surface emitting semiconductor laser, the insulating layer is preferably formed of a polyimide resin, acrylic resin, or epoxy resin.

In the case of forming an insulating layer using such a resin, the resin is cured by irradiating with energy rays such as heat or light. The resin shrinks significantly in volume during curing, thereby causing a large amount of tensile strain in the semiconductor deposit due to the volume shrinkage. Specifically, a large amount of tensile stress is applied to the semiconductor deposit including the active layer from the insulating layer. Because of this, a large amount of stress can be applied to the active layer, whereby the polarization direction of laser light can be controlled more stably.

In the surface emitting semiconductor laser according to the present invention, the planar configuration of the insulating layer may be rectangular, diamond-shaped, elliptical, or the like.

A surface emitting semiconductor laser array according to the present invention is formed by arraying a plurality of the above-described surface emitting semiconductor lasers according to the present invention.

Since this surface emitting semiconductor laser array is formed by arraying a plurality of surface emitting semiconductor lasers, a surface emitting laser array can be appropriately fabricated according to the application and purpose by forming a predetermined number of surface emitting lasers in a predetermined arrangement.

DESCRIPTION OF PREFERRED
EMBODIMENTS OF THE INVENTION

Figure 1:
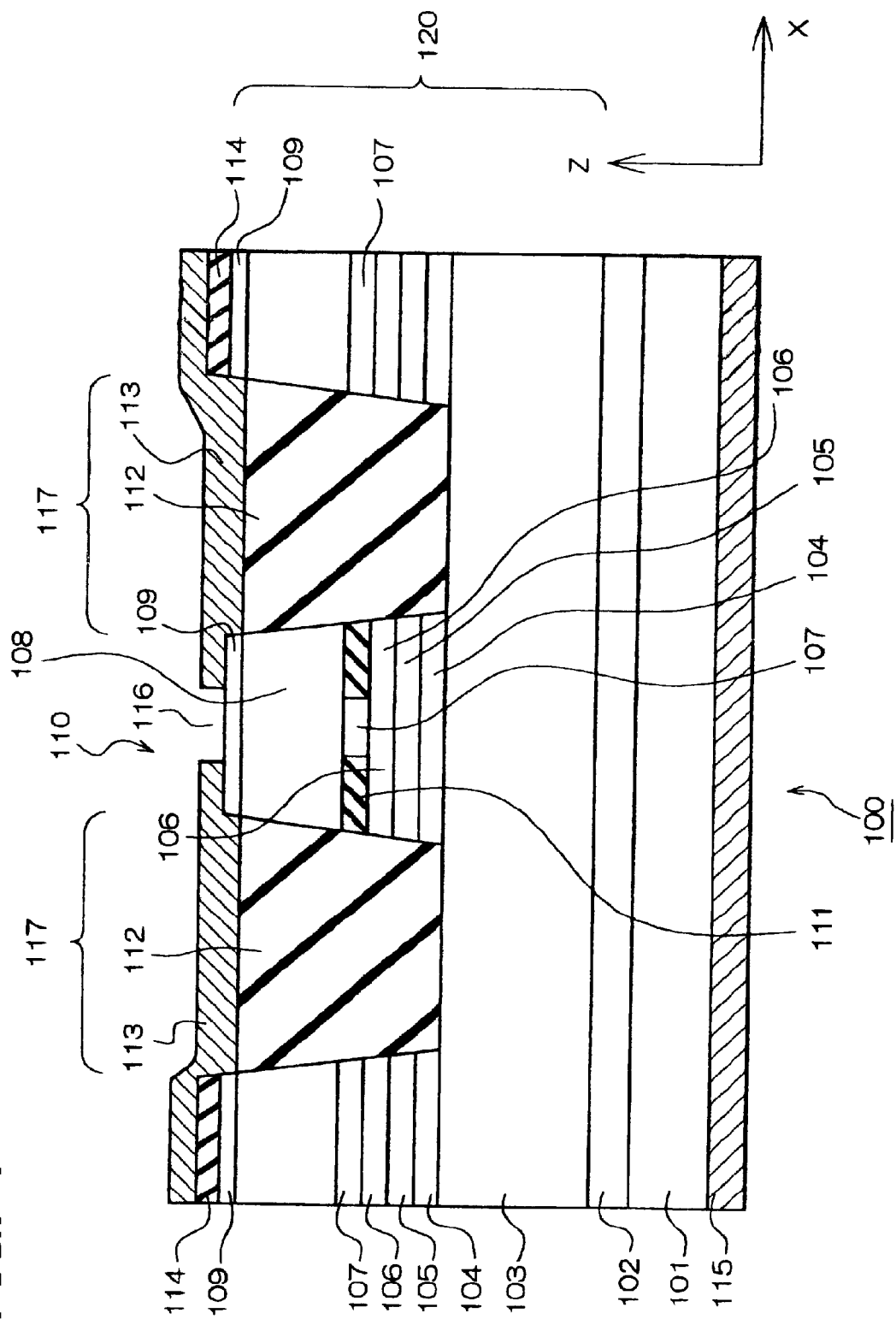
FIG. 1 is a view schematically showing the cross section of a surface emitting semiconductor laser according to a first embodiment of the present invention.
Figure 2:
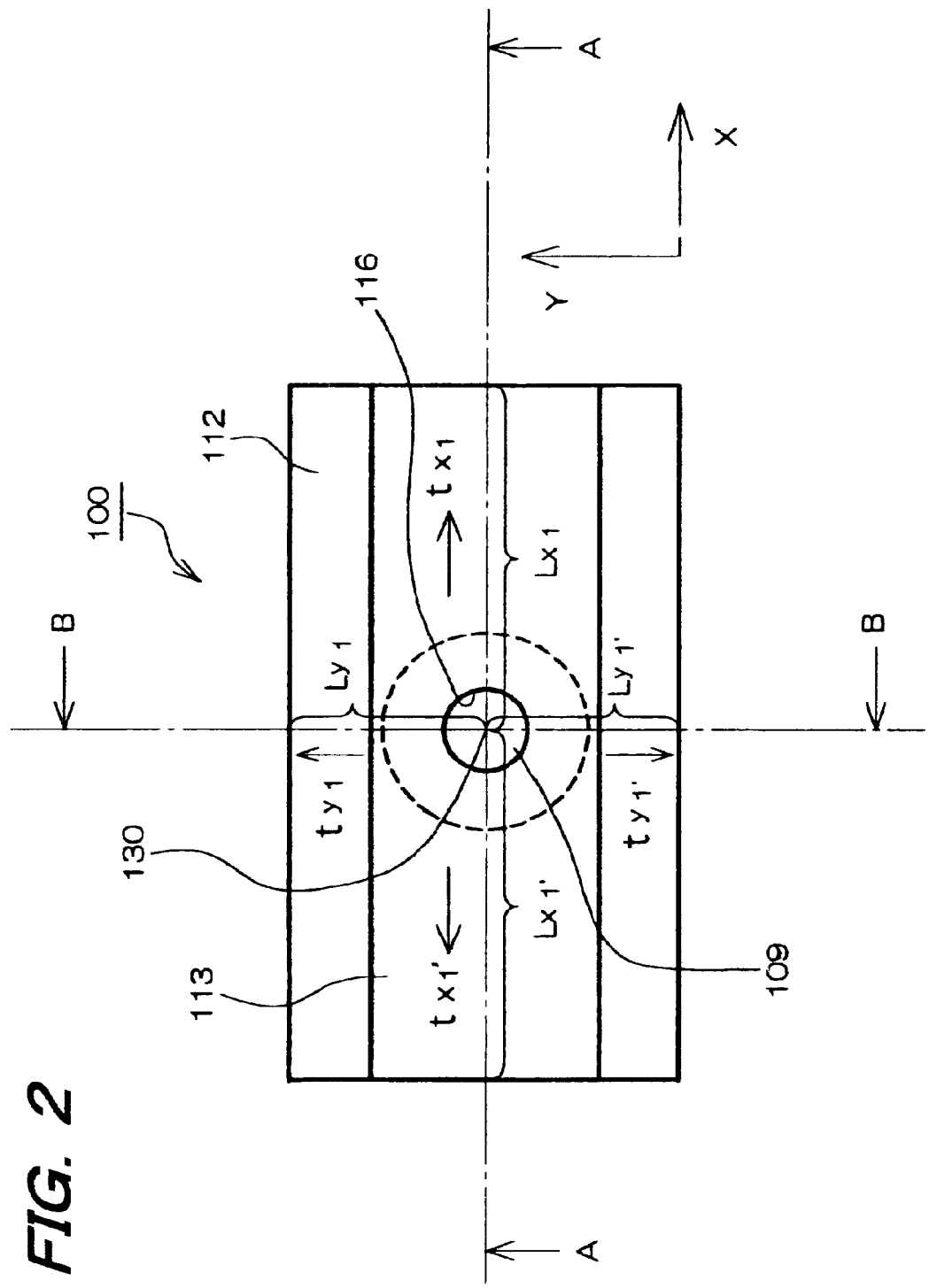
FIG. 2 is a plan view schematically showing a major portion of the surface emitting semiconductor laser shown in FIG. 1 from the side facing the light emitting aperture.
Figure 3:
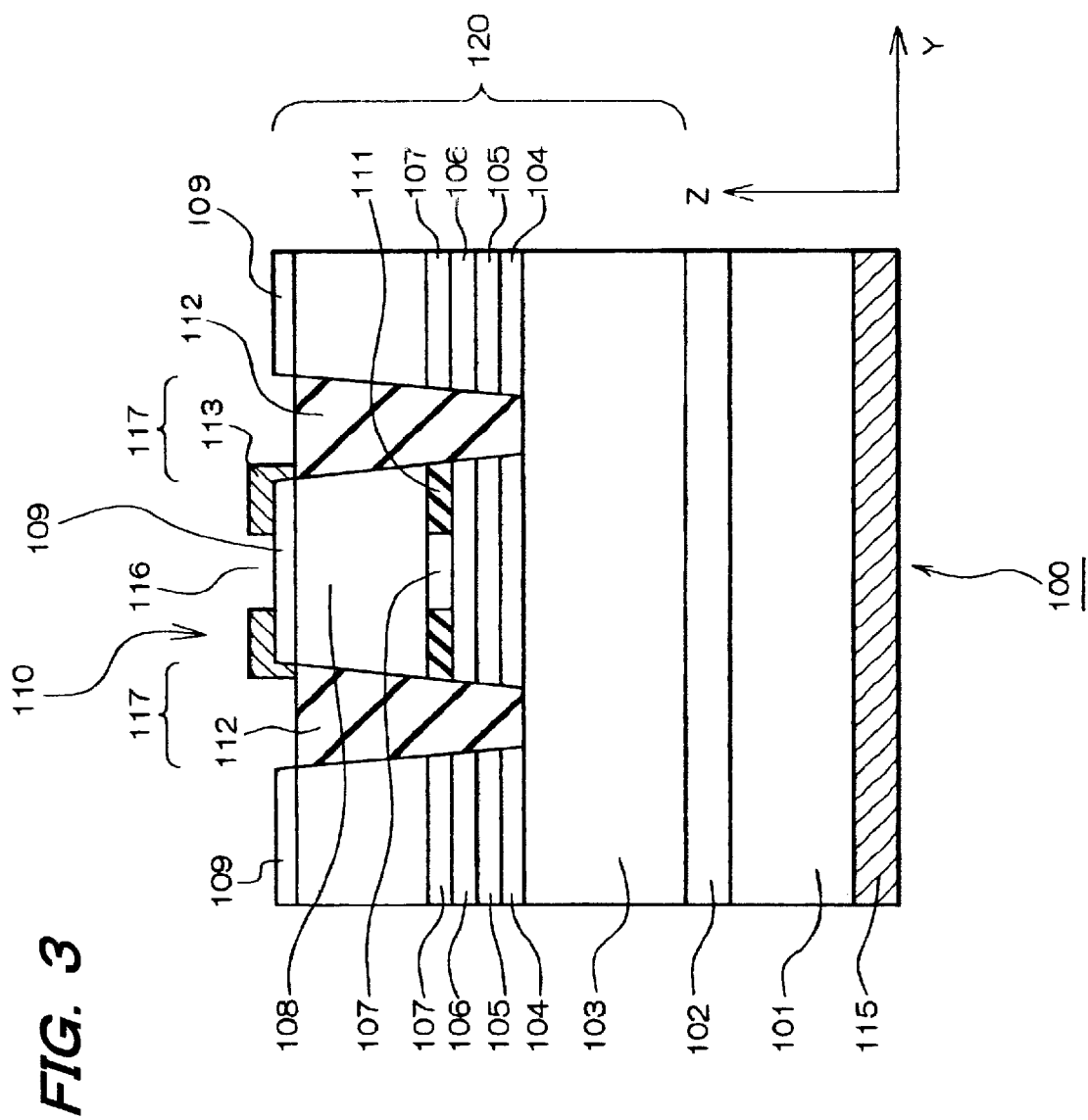
FIG. 3 is a view schematically showing the cross section of the surface emitting semiconductor laser shown in FIG. 2 along the line B—B.

Preferred embodiments of the present invention will be described below with reference to drawings.
(First Embodiment)
1. Device Structure FIG. 1 is a cross-sectional view showing a surface emitting semiconductor laser (hereinafter called "surface emitting laser") 100 according to a first embodiment of the present invention along the line A—A shown in FIG. 2. FIG. 2 is a plan view schematically showing a major portion of the surface emitting laser 100 shown in FIG. 1 from the side facing the light emitting aperture. FIG. 3 is a cross-sectional view showing the structure shown in FIG. 2 along the line B—B.

The surface emitting laser 100 according to the first embodiment of the present invention has a vertical-cavity resonator (hereinafter called "resonator") 120 and an insulating layer 112 which is formed in contact with the side of the resonator 120. The insulating layer 112 exhibits anisotropic stress which allows the polarization direction of laser light to be controlled.

First, the structure of the surface emitting laser 100 shown in FIGS. 1 to 3 will be described. The surface emitting laser 100 has a semiconductor substrate 101, an n-type GaAs buffer layer 102 formed on the semiconductor substrate 101, the resonator 120, and a p-type GaAs contact layer 109 formed on the resonator 120.

The resonator 120 includes a distributed-reflection type multilayer mirror 103 formed on the buffer layer 102 in which 30 pairs of n-type AlAs layers and n-type $Al_{0.15}Ga_{0.85}As$ layers are laminated alternately (hereinafter called "lower mirror"), an n-type cladding layer 104 formed of n-type $Al_{0.5}Ga_{0.5}As$, an active layer 105 formed of GaAs well layers and $Al_{0.3}Ga_{0.7}As$ barrier layers having a multiple quantum well structure in which the well layers are formed of three layers, a p-type cladding layer 106 formed of $Al_{0.5}Ga_{0.5}As$, a current blocking layer 107 formed of p-type AlAs, an insulator layer 111 formed around the current blocking layer 107, and a distributed-reflection type multilayer mirror 108 in which 25 pairs of p-type $Al_{0.85}Ga_{0.15}As$ layers and p-type $Al_{0.15}Ga_{0.85}As$ layers are laminated alternately (hereinafter called "upper mirror"). These layers are laminated in that order.

The upper mirror 108 which is Zn-doped is p-type and the lower mirror 103 which is Se-doped is n-type. Therefore, the upper mirror 108, undoped active layer 105, and lower mirror 103 form a pin diode.

The resonator 120 is etched from the light emitting side of the surface emitting laser 100 to the n-type cladding layer 104 in the shape of a circle when viewed from the light emitting side, whereby a columnar portion 110 is formed. Specifically, the columnar portion 110 is a columnar semiconductor deposit which is part of the resonator 120. In the present embodiment, the planar configuration of the columnar portion 110 is in the shape of a circle. Note that the columnar portion 110 may have a different shape. Part of the resonator 120 is etched from the contact layer 109 to the n-type cladding layer 104, whereby a groove 117 is formed.

In the surface emitting laser 100 according to the present embodiment, the insulating layer 112 is embedded in the groove 117. Specifically, the insulating layer 112 is formed in contact with the side of the columnar portion 110 to cover the upper side of the lower mirror 103. In the surface emitting laser 100 according to the present embodiment, the insulating layer 112 exhibits anisotropic stress caused by the planar configuration thereof. Since the insulating layer 112 has such an anisotropic stress, the polarization direction of laser light can be controlled for reasons described later.

The planar configuration of the insulating layer 112 is rectangular and has the following characteristics. Assuming that the axes intersecting at right angles through the center 130 of the upper side of the columnar portion 110 are respectively the x-axis and y-axis, it is preferable that the side lengths of the planar configuration of the insulating layer 112 in the x-axial direction differ from the side lengths in the y-axial direction, as shown in FIG. 2. For example, the insulating layer 112 may be formed so that the distance Lx1 between the center 130 and the intersection point between the x-axis and the side of the insulating layer 112 is greater than the distance Ly1 between the center 130 and the intersection point between the y-axis and the side of the insulating layer 112. It is also preferable that the side lengths of the planar configuration of the insulating layer 112 in the −x-axial direction differ from the side lengths in the −y-axial direction. For example, the insulating layer 112 may be formed so that the distance Lx1' between the center 130 and the intersection point between the −x-axis and the side of the insulating layer 112 is greater than the distance Ly1' between the center 130 and the intersection point between the −y-axis and the side of the insulating layer 112. In the surface emitting laser 100, the insulating layer 112 is formed so that the distances Lx1 and Lx1' and the distances Ly1 and Ly1' are respectively equal. In the surface emitting laser 100 having the above configuration, an anisotropic stress including stresses in the x-axial direction and the y-axial direction in different amounts is applied to the columnar portion 110 including the active layer 105 from the insulating layer 112.

The present embodiment illustrates the case where the planar configuration of the insulating layer 112 in the surface emitting laser 100 is symmetrical with regard to both the x-axis and the y-axis. It is preferable that the planar configuration of the insulating layer 112 be symmetrical with regard to at least either the x-axis or y-axis. Reasons therefor will be described later.

As the material for forming the insulating layer 112, resins cured by irradiating with energy rays such as heat or light, such as polyimide resins, acrylic resins, or epoxy resins can be used.

An upper electrode 113 is formed on the columnar portion 110, insulating layer 112, and semiconductor layer which does not form the columnar portion 110. An insulating layer 114 for insulating the upper electrode 113 from the semiconductor layer is formed on the semiconductor layer which does not form the columnar portion 110.

An aperture of electrode 116 is formed at the center of the upper side of the columnar portion 110 as a light emitting aperture. A lower electrode 115 is formed on the side of the semiconductor substrate 101 opposite to the side with the resonator 120 formed thereon.

The aluminium oxide insulator layer 111 is formed in the region several micrometers from the circumference of the current blocking layer 107 in order to concentrate the current from the upper electrode 113 upon the center of the columnar portion 110.

2. Device Fabrication Process

A method of fabricating the surface emitting laser 100 according to the present embodiment will be described with reference to FIGS. 4 to 8. FIGS. 4 to 8 are cross-sectional views schematically showing the steps of the method of fabricating the surface emitting laser 100 according to the present embodiment.

The method of fabricating the surface emitting laser 100 according to the present embodiment includes the following steps (a) to (c).

The step (a) includes forming a semiconductor deposited layer 150 including the active layer 105 on the surface of the semiconductor substrate 101, and forming the columnar portion 110, from which laser light is emitted in the direction perpendicular to the semiconductor substrate 101, from the semiconductor deposited layer 150.

The step (b) includes forming the insulating layer 112 on the side of the columnar portion 110 by filling the groove 117 with the insulating layer 112.

The step (c) includes forming the upper electrode 113 and the lower electrode 115 on the resonator 120.

First, the step (a) will be described.

Figure 4:
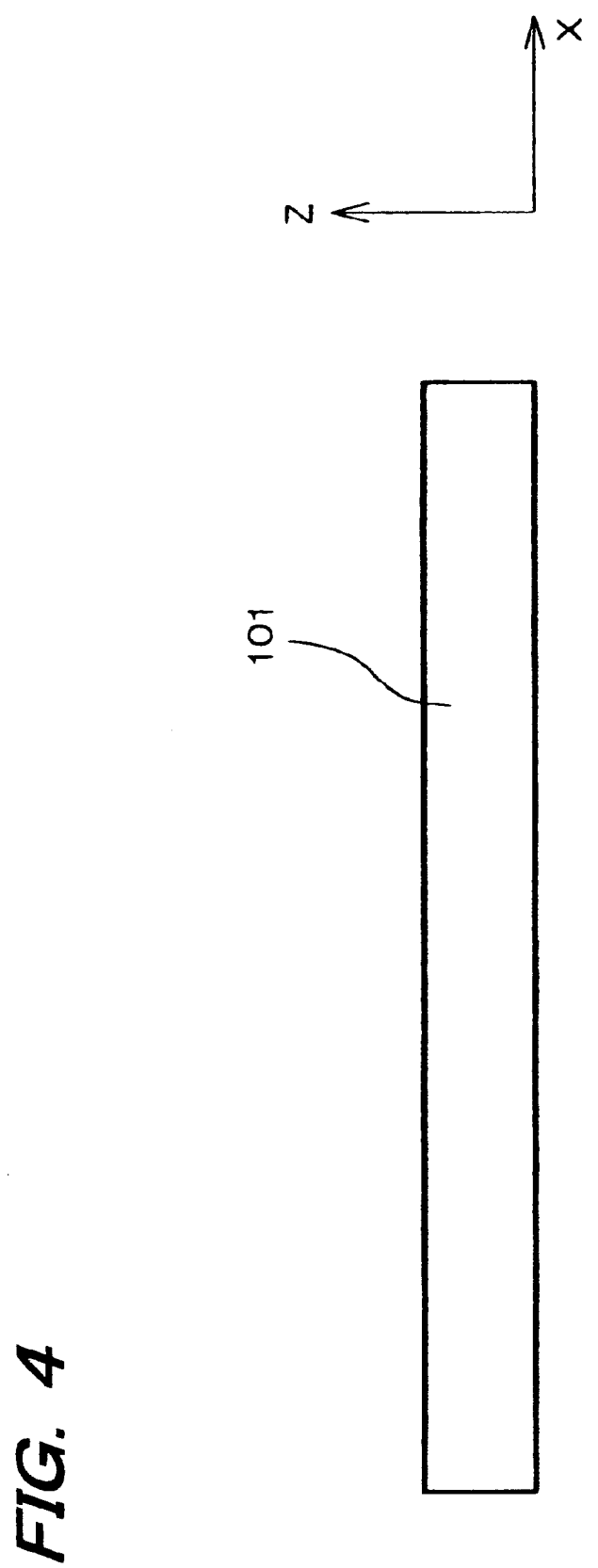
FIG. 4 is a cross-sectional view schematically showing a first step of a method of fabricating the surface emitting semiconductor laser according to the first embodiment of the present invention.
Figure 5:
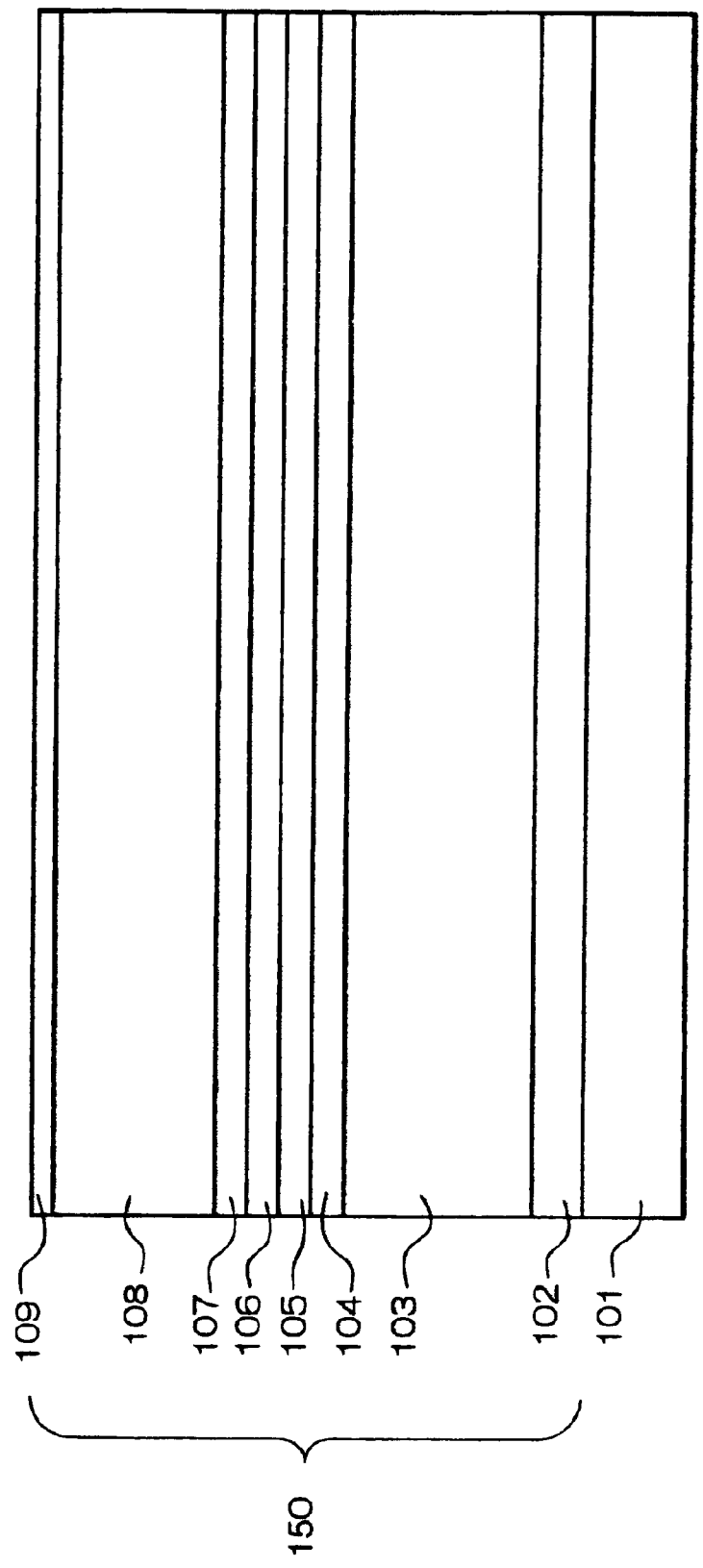
FIG. 5 is a cross-sectional view schematically showing a second step of a method of fabricating the surface emitting semiconductor laser according to the first embodiment of the present invention.

(1) The semiconductor deposited layer 150 shown in FIG. 5 is epitaxially grown on the surface of the n-type GaAs semiconductor substrate 101 shown in FIG. 4 while modifying the composition. The semiconductor deposited layer 150 includes the buffer layer 102 formed of n-type GaAs, the lower mirror 103 in which n-type AlAs layers and n-type $Al_{0.15}Ga_{0.85}As$ layers are laminated alternately, the n-type cladding layer 104 formed of n-type $Al_{0.5}Ga_{0.5}As$, the active layer 105 formed of GaAs well layers and $Al_{0.3}Ga_{0.7}As$ barrier layers having a multiple quantum well structure in which the well layers are formed of three layers, the p-type cladding layer 106 formed of $Al_{0.5}Ga_{0.5}As$, the current blocking layer 107 formed of p-type AlAs, the upper mirror 108 in which p-type $Al_{0.85}Ga_{0.15}As$ layers and p-type $Al_{0.15}Ga_{0.85}As$ layers are laminated alternately, and the contact layer 109 formed of p-type GaAs. These layers are deposited on the semiconductor substrate 101 in that order, thereby forming the semiconductor deposited layer 150. The surface of the semiconductor substrate 101 is the side of the semiconductor substrate 101 on which the resonator 120 is formed in the step described later.

The epitaxial growth temperature is appropriately determined according to the type of the semiconductor substrate 101 or the type or thickness of the semiconductor deposited layer 150. The epitaxial growth temperature is preferably 600–800° C. A period of time required for the epitaxial growth is also appropriately determined. As the epitaxial growth method, the MOVPE (Metal-Organic Vapor Phase Epitaxy) method, MBE (Molecular Beam Epitaxy) method, or LPE (Liquid Phase Epitaxy) method can be used.

Figure 6:
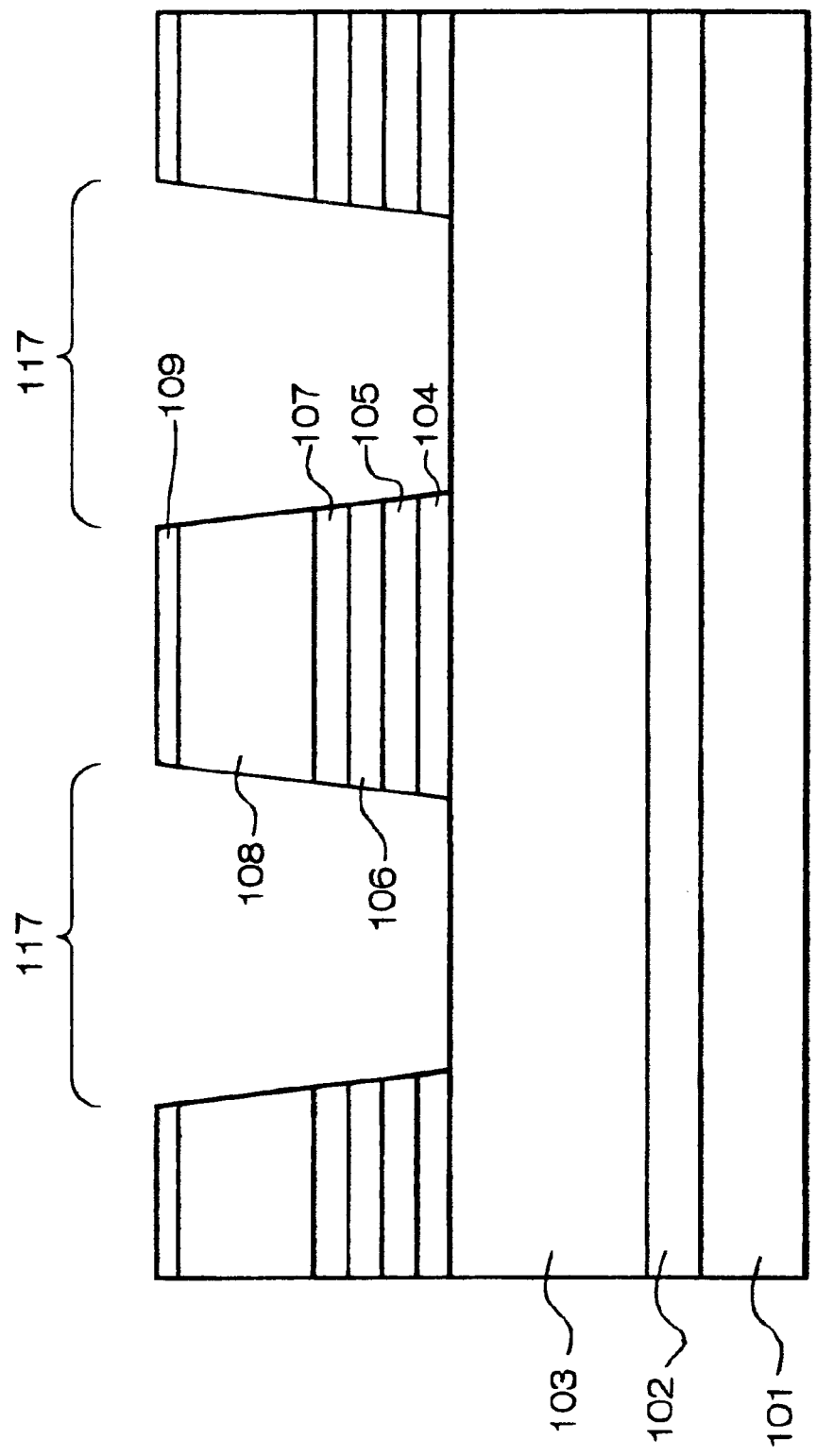
FIG. 6 is a cross-sectional view schematically showing a third step of a method of fabricating the surface emitting semiconductor laser according to the first embodiment of the present invention.

(2) A photoresist (not shown) is applied to the contact layer 109 and then patterned using photolithography, thereby forming a resist layer (not shown) with a predetermined pattern. The groove 117 with a rectangular planar configuration is formed by dry-etching the contact layer 109, upper mirror 108, current blocking layer 107, p-type cladding layer 106, active layer 105, and n-type cladding layer 104 using the resist layer as a mask as shown in FIG. 6, thereby forming the columnar portion 110 which is a columnar semiconductor deposit.

In this case, the configuration of the insulating layer 112 to be embedded in the groove 117 in the step described later can be appropriately determined by adjusting the planar configuration and the thickness of the groove 117. In the present embodiment, assuming that the axes intersecting at right angles through the center 130 of the upper side of the columnar portion 110 are respectively the x-axis and y-axis, the groove 117 is formed so that the distance between the center 130 and the intersection point between the x-axis and the side of the groove 117 is greater than the distance between the center 130 and the intersection point between the y-axis and the side of the groove 117. The groove 117 is formed so that the distance between the center 130 and the intersection point between the −x-axis and the side of the groove 117 is greater than the distance between the center 130 and the intersection point between the −y-axis and the side of the groove 117.

Figure 7:
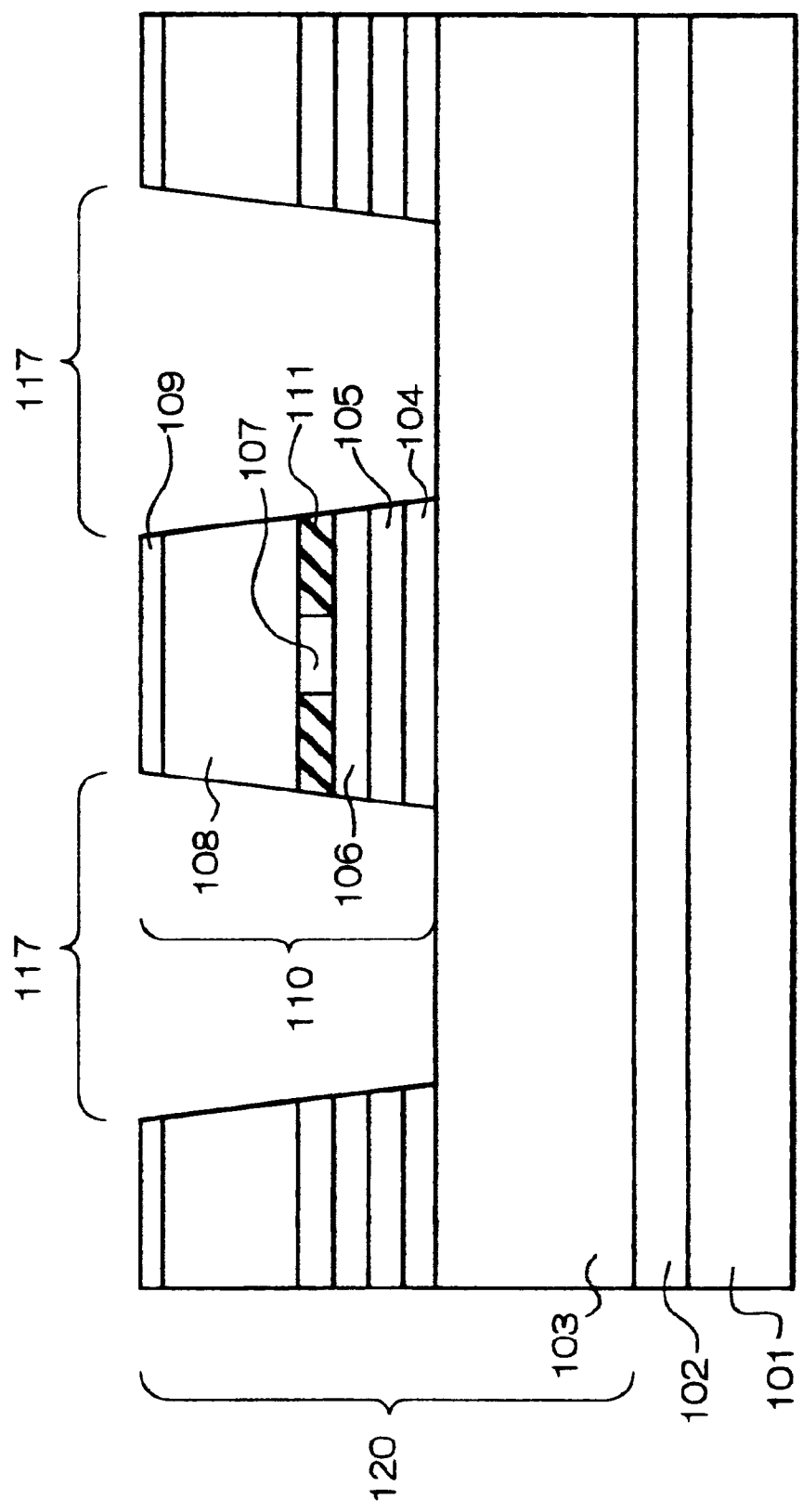
FIG. 7 is a cross-sectional view schematically showing a fourth step of a method of fabricating the surface emitting semiconductor laser according to the first embodiment of the present invention.
Figure 8:
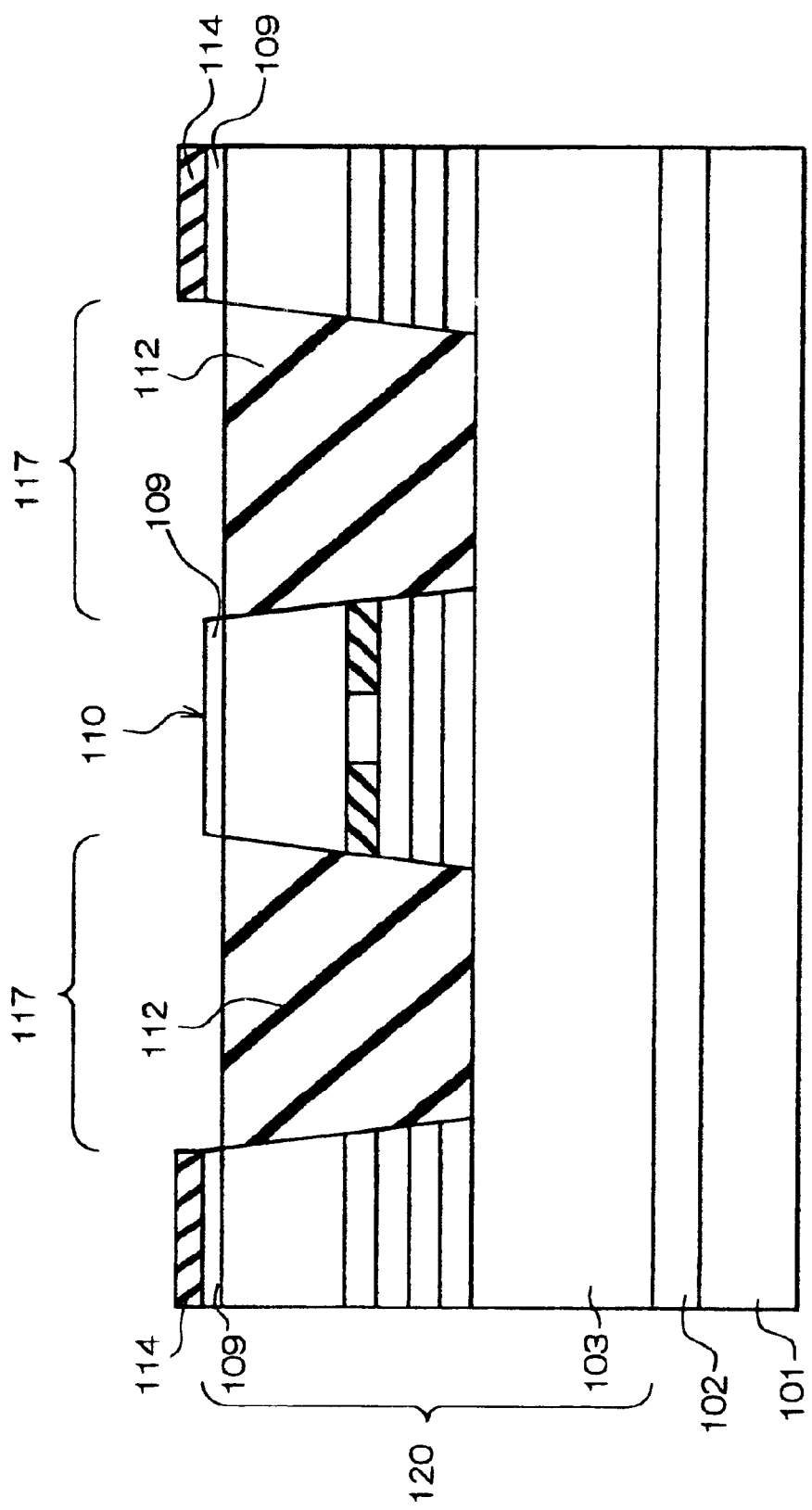
FIG. 8 is a cross-sectional view schematically showing a fifth step of a method of fabricating the surface emitting semiconductor laser according to the first embodiment of the present invention.

(3) The current blocking layer 107 formed of a p-type AlAs layer is exposed to a steam atmosphere at about 400° C. The AlAs layer is oxidized from the exposed area toward the inside thereof, whereby aluminum oxide as an insulator is formed. Specifically, the circumference of the current blocking layer 107 is oxidized, whereby the aluminum oxide insulator layer 111 is formed as shown in FIG. 7. The resonator 120 is thus formed on the semiconductor substrate 101.

Next, the step (b) is described below.

In this step, the insulating layer 112 is formed by filling the groove 117 with a liquid resin or a liquid resin precursor.

First, a liquid resin or a liquid resin precursor is applied to the groove 117 and then dried. As the application method, conventional methods such as a spin coating method, dipping method, or spray coating method can be employed.

The resin material in the groove 117 is cured by irradiating with energy rays such as heat or light. This causes the resin to shrink in volume, whereby stress occurs in the columnar portion 110.

The resin outside the groove 117 is then removed. As the removal method, a method of patterning the resin using photolithography, a method using dry etching, a CMP method, or the like can be used. The insulating layer 112 embedded in the groove 117 is thus formed on the side of the columnar portion 110.

In the above step, since the insulating layer 112 is formed by filling the groove 117 with a liquid resin or a liquid resin precursor, the configuration and the size of the insulating layer 112 are determined by those of the groove 117. Therefore, the planar configuration of the insulating layer 112 is the same as that of the groove 117.

As the liquid resin or liquid resin precursor used in this step, resins cured by irradiating with energy rays such as heat or light are used. As examples of such liquid resins, polyacrylic resins and epoxy resins can be given. As examples of the liquid resin precursors, polyimide precursors can be given. These liquid resins and liquid resin precursors have low viscosity and shrink in volume significantly during curing.

As examples of polyimide precursors, polyamic acid, long-chain alkyl ester of polyamic acid, and the like can be given. In the case of using a polyimide precursor as the liquid resin precursor, a liquid polyimide precursor is applied to the groove 117 and heated. This causes imidation to occur, whereby a polyimide resin is formed. The insulating layer 112 is thus formed. The heating temperature is suitably 150–400° C., although the temperature varies depending on the type of polyimide precursor.

In the case of using a polyacrylic resin or epoxy resin as the liquid resin, it is preferable to use UV-curable polyacrylic resins or epoxy resins. Since UV-curable resins can be cured by only irradiating with ultraviolet rays, problems such as damage to the device due to heat can be avoided.

The step (c) is described below.

The insulating layer 114 for insulating the upper electrode 113 from the semiconductor layer is formed on the semiconductor layer which does not form the columnar portion 110. After forming an alloy layer of gold or zinc on the upper side of the insulating layer 112 using a vacuum evaporation process, the alloy layer is patterned using photolithography, thereby forming the aperture of electrode 116. The upper electrode 113 is thus formed. Then, the lower electrode 115 formed of a gold/germanium alloy layer is formed on the bottom of the semiconductor substrate 101 using a vacuum evaporation process. The bottom of the semiconductor substrate 101 means that the side opposite to the side on which the resonator 120 is formed. The surface emitting laser 100 shown in FIGS. 1 to 3 is obtained by the above process.

3. Operation, Action, and Effects of Device

Ordinary operation of the surface emitting laser 100 according to the first embodiment will be described below.

When applying a forward voltage to the pin diode between the upper electrode 113 and the lower electrode 115, recombinations of electrons and holes occur in the active layer 105, thereby causing emission of light. Stimulated emissions occur during the period the light reciprocates between the upper mirror 108 and the lower mirror 103, whereby the light intensity is amplified. When the optical gain exceeds the optical loss, laser oscillation occurs, whereby laser light is emitted perpendicularly to the semiconductor substrate 101 from the aperture of electrode 116 in the upper electrode 113.

The action and the effects of the surface emitting laser 100 according to the first embodiment will be described.

(1) In the surface emitting laser 100 according to the first embodiment, the insulating layer 112 is formed in contact with the side of the columnar portion 110. The insulating layer 112 exhibits anisotropic stress caused by the planar configuration thereof, which allows the polarization direction of laser light to be controlled.

The anisotropic stress includes stresses in the directions intersecting at right angles in different amounts. In other words, the anisotropic stress includes stresses in the x-axial direction and in the y-axial direction in different amounts.

Since the insulating layer 112 exhibits anisotropic stress, the anisotropic stress can be directly applied to the active layer 105 included in the columnar portion 110 from the insulating layer 112. Specifically, since the insulating layer 112 exhibits anisotropic stress, such an anisotropic stress is applied to the active layer 105 in the columnar portion 110 in contact with the insulating layer 112, whereby the gain of the laser light exhibits anisotropy. As a result, laser light in the specific polarization direction can be preferentially amplified, whereby the polarization direction of laser light can be controlled in a specific direction.

(2) In the surface emitting laser 100, the planar configuration of the insulating layer 112 is designed so that the distances Lx1 and Lx1' are respectively greater than the distances Ly1 and Ly1', as shown in FIG. 2.

Specifically, in the surface emitting laser 100, the insulating layer 112 is formed so that the distance between the center 130 and the intersection point between the x-axis and the side of the insulating layer 112 is greater than the distance between the center 130 and the intersection point between the y-axis and the side of the insulating layer 112. Because of this, the stress applied to the active layer 105 from the insulating layer 112 exhibits anisotropy. As a result, the gain of the active layer 105 for polarized light in the direction perpendicular to the direction in which the amount of stress is the greatest of the x-axial direction and y-axial direction becomes preferential, whereby laser light polarized in the direction perpendicular to the direction in which the amount of stress is the greatest of the x-axial direction and y-axial direction can be obtained. The polarization direction of laser light can be thus controlled.

Among the stresses applied to the active layer 105, assuming that the stress in the +x-axial direction is tx1, the stress in the +y-axial direction is ty1, the stress in the −x-axial direction is tx1', and the stress in the −y-axial direction is ty1', the planar configuration of the insulating layer 112 is designed so that the distances Lx1 and Lx1' are respectively greater than the distances Ly1 and Ly1'. Therefore, the stresses tx1 and tx1' are respectively greater than the stresses ty1 and ty1'. Specifically, in the surface emitting laser 100 according to the first embodiment, the stresses in the direction parallel to the x-axis are greater than the stresses in the direction parallel to the y-axis. As a result, the gain of the active layer 105 for polarized light in the direction perpendicular to the x-axis becomes preferential, whereby laser light polarized in the direction perpendicular to the x-axis can be obtained. The polarization direction of laser light can be thus controlled.

(3) In the surface emitting laser 100 according to the first embodiment, the insulating layer 112 is formed in contact with the entire side of the columnar portion 110 including the active layer 105. Therefore, a surface emitting laser in which not only the active layer 105 but also the layers other than the active layer 105 included in the columnar portion 110 are provided with an anisotropic stress can be obtained. Providing an anisotropic stress to the layers other than the active layer 105 in the resonator 120 produces changes in the refractive index in the direction in which the strain is applied. As a result, a refractive index difference is produced between the direction in which the strain is applied and the direction intersecting such a direction at right angles. In a medium having such a refractive index distribution, only light with a certain polarization component can be transmitted due to the refractive index difference. Therefore, the surface emitting laser according to the present embodiment has the same effect as that of an elliptical core fiber which is one type of polarization maintaining fiber, for example. The elliptical core fiber has elliptical core having refractive index difference between the major axial direction and the minor axial direction.

(4) In the surface emitting laser 100 according to the present embodiment, since the planar configuration of the insulating layer 112 is rectangular, the insulating layer 112 formed in contact with the side of the columnar portion 110 exhibits anisotropic stress. In the case where the planar configuration of the insulating layer 112 is rectangular, the stresses in the direction parallel to the longer sides of the rectangle is greater than the stresses in the direction parallel to the shorter sides thereof. As a result, the gain of the active layer 105 in the direction parallel to the shorter sides of the rectangle becomes preferential, whereby laser light polarized in the direction parallel to the shorter sides can be obtained. As described above, since light in the specific polarization direction can be preferentially amplified, the polarization direction of laser light can be controlled in a specific direction.

(5) In the surface emitting laser 100, the planar configuration of the insulating layer 112 is symmetrical with regard to the x-axis and y-axis, respectively, as shown in FIG. 2. Since the planar configuration of the insulating layer 112 is symmetrical with regard to the x-axis, the stress ty1 in the y-axial direction and the stress ty1' in the −y-axial direction are equivalent and face 180 degrees in opposite directions.

In the surface emitting laser 100, the planar configuration of the insulating layer 112 is also symmetrical with regard to the y-axis. Therefore, the stress tx1 in the x-axial direction and the stress tx1' in the −x-axial direction are equivalent and face 180 degrees in opposite directions. Since the distances Lx1 and Lx1' are greater than the distances Ly1 and Ly1', the stresses tx1 and tx1' are greater than the stresses ty1 and ty1'. Polarization of the laser light can be more securely controlled in the direction perpendicular to the direction in which the amount of stress is the greatest of the x-axial direction and y-axial direction. Terefore, polarization of the laser light can be controlled in the y-axial direction.

Because of this, the above effects can be achieved by designing the planar configuration of the insulating layer 112 to be symmetrical with regard to at least either the x-axis or y-axis.

(6) In the surface emitting laser 100, the insulating layer 112 is embedded in the groove, as shown in FIG. 1. Providing the above configuration to the surface emitting laser 100 ensures that anisotropic stress occurs in the insulating layer 112 to be applied to the entire area of the columnar portion 110 including the active layer 105 through the side of the columnar portion 110, whereby polarization of laser light can be securely controlled.

In particular, in the case where the insulating layer 112 is formed using a polyimide resin, acrylic resin, or epoxy resin, these resins shrink in volume significantly during curing by irradiation with energy rays such as heat or light when forming the insulating layer 112, thereby causing a large amount of tensile strain in the columnar portion 110. Specifically, a large amount of tensile stress is applied to the columnar portion 110 including the active layer 105 from the insulating layer 112. Because of this, a large amount of stress can be applied to the active layer 105, whereby the polarization direction of laser light can be controlled more stably.

(Second Embodiment)
1. Device Structure

Figure 9:
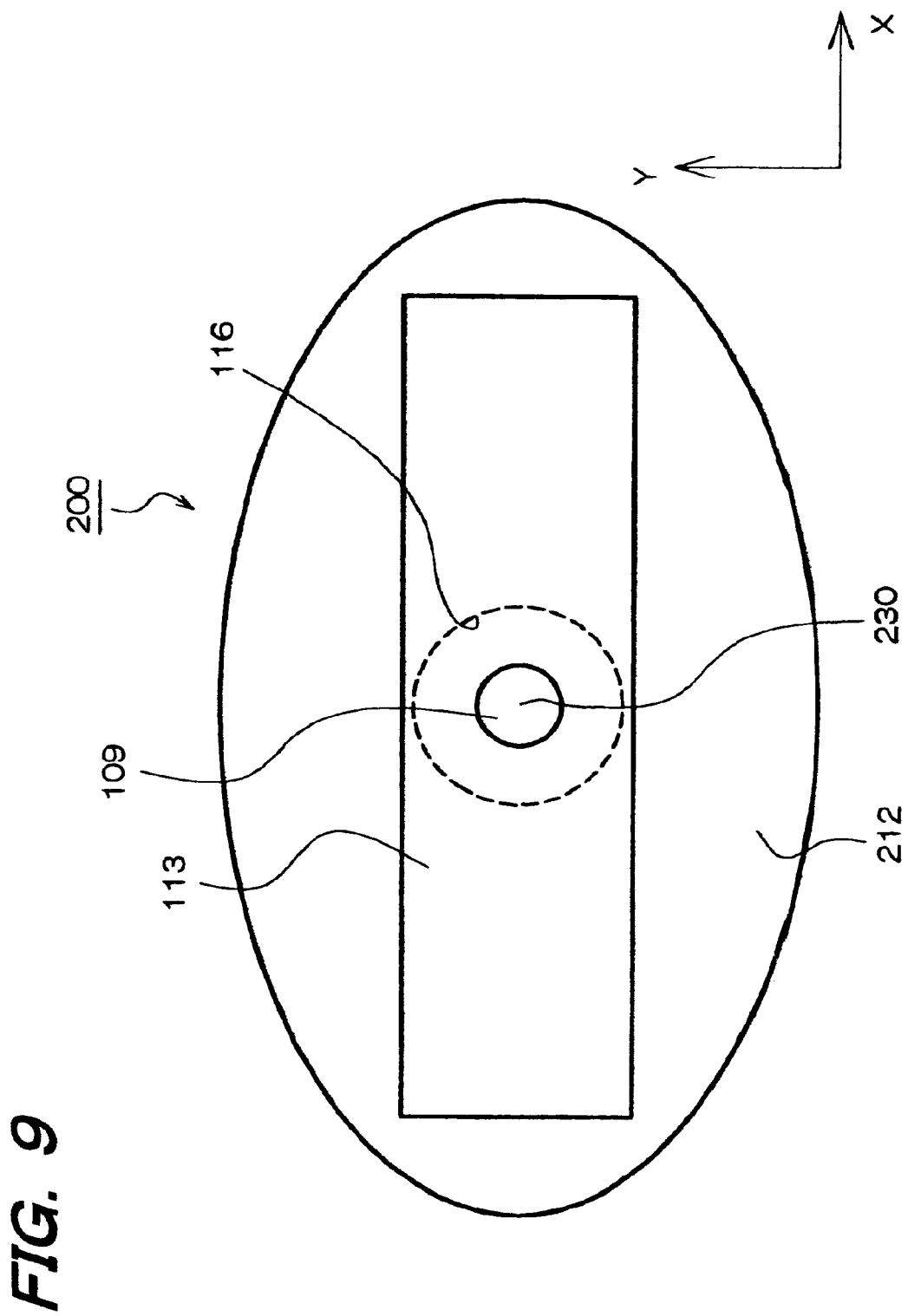
FIG. 9 is a plan view schematically showing a major portion of a surface emitting semiconductor laser according to a second embodiment of the present invention from the side facing the light emitting aperture.

FIG. 9 is a plan view schematically showing a major portion of a surface emitting laser 200 according to a second embodiment of the present invention from the side facing a light emitting aperture.

The first embodiment illustrates the case where the planar configuration of the insulating layer 112 in the surface emitting laser is rectangular. The planar configuration of the insulating layer 112 is not limited to this. The planar configuration of an insulating layer 212 in the surface emitting laser 200 according to the second embodiment is elliptical. Moreover, the planar configuration of the insulating layer 212 may be polygonal such as diamond-shaped, triangular, hexagonal, or octagonal.

In the surface emitting laser 100 according to the first embodiment, the insulating layer 112 is formed in the groove 117. In the surface emitting laser 200 according to the second embodiment, the insulating layer 212 is formed on the lower mirror 103 by patterning.

2. Device Fabrication Process

The method of fabricating the surface emitting laser according to the second embodiment is almost the same as that for the surface emitting laser according to the first embodiment. The difference between the method of the first embodiment and that of the second embodiment is as follows. In the surface emitting laser 100 according to the first embodiment, the groove 117 is formed by etching the semiconductor deposited layer 150 and the insulating layer 112 is embedded in the groove 117. In the surface emitting laser 200 according to the second embodiment, the insulating layer 212 with an elliptical planar configuration is formed on the lower mirror 103 by patterning.

3. Operation, Action, and Effects of Device

The operation of the surface emitting laser according to the second embodiment is the same as that of the surface emitting laser according to the first embodiment. Therefore, further description thereof is omitted.

The action and effects of the surface emitting laser according to the second embodiment are almost the same as those of the surface emitting laser according to the first embodiment. Therefore, description thereof is omitted.

(Third Embodiment)
1. Device Structure

Figure 10:
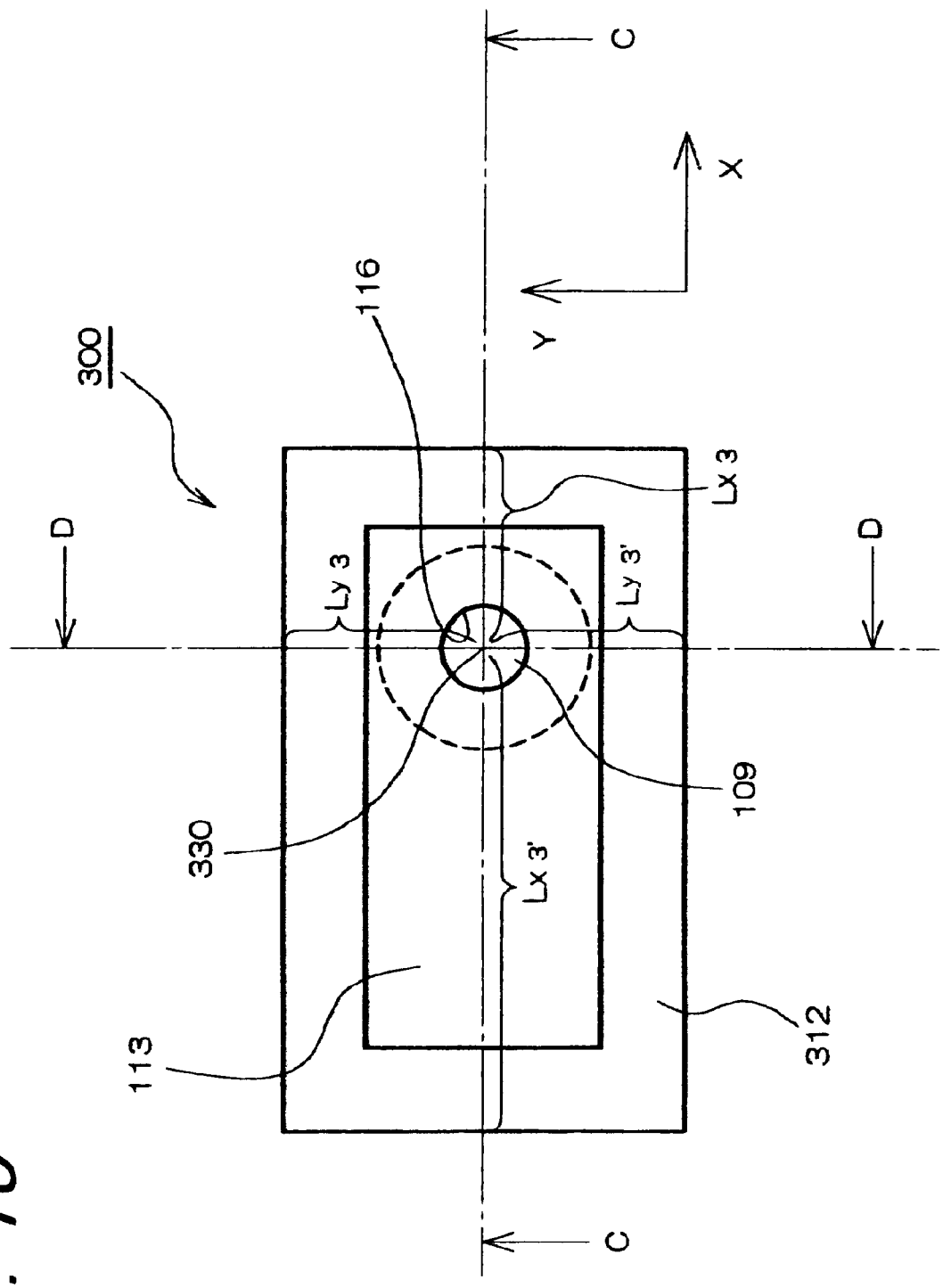
FIG. 10 is a plan view schematically showing a major portion of a surface emitting semiconductor laser according to a third embodiment of the present invention.
Figure 11:
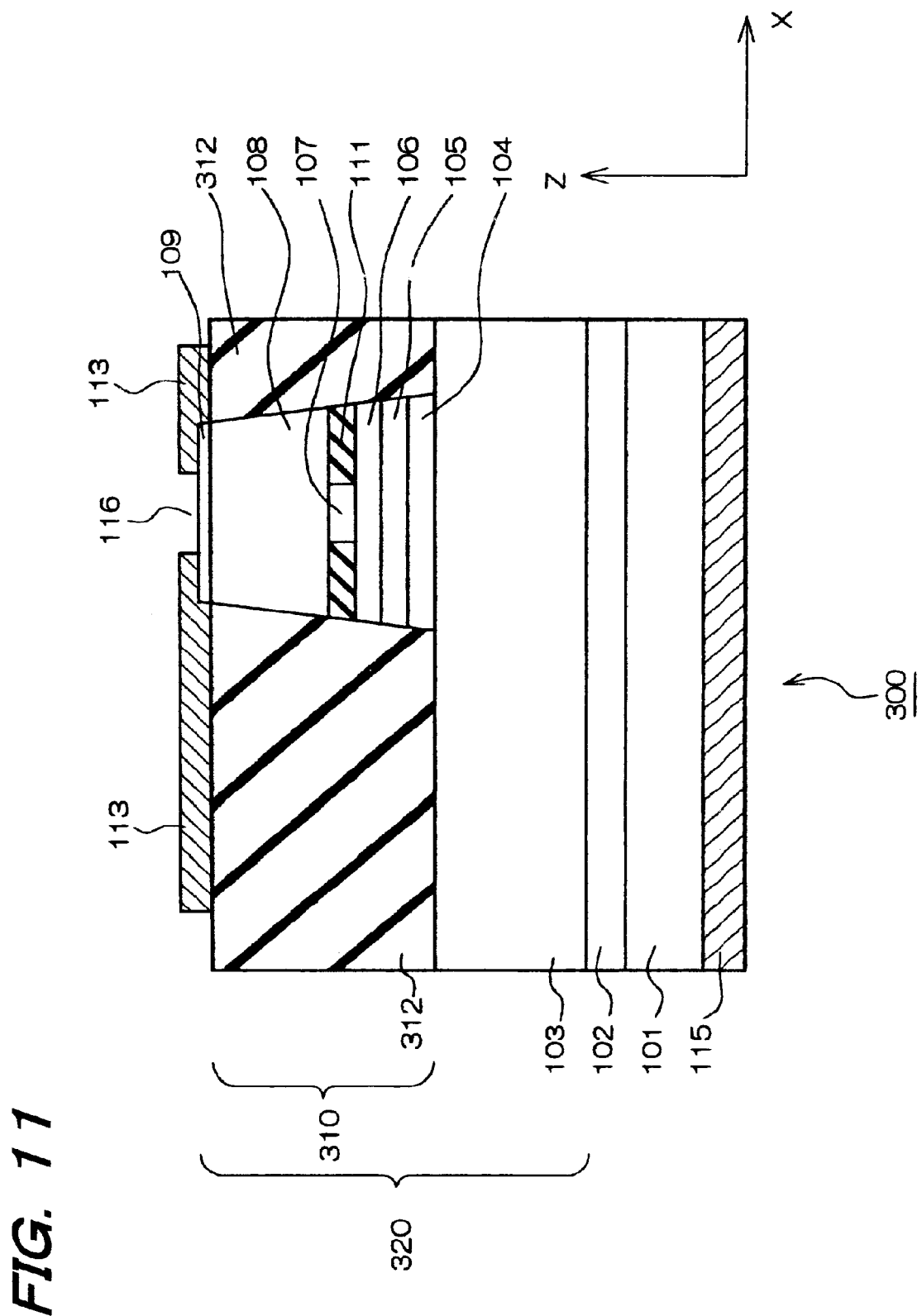
FIG. 11 is a view schematically showing the cross section of the surface emitting semiconductor laser shown in FIG. 10 along the line C—C.
Figure 12:
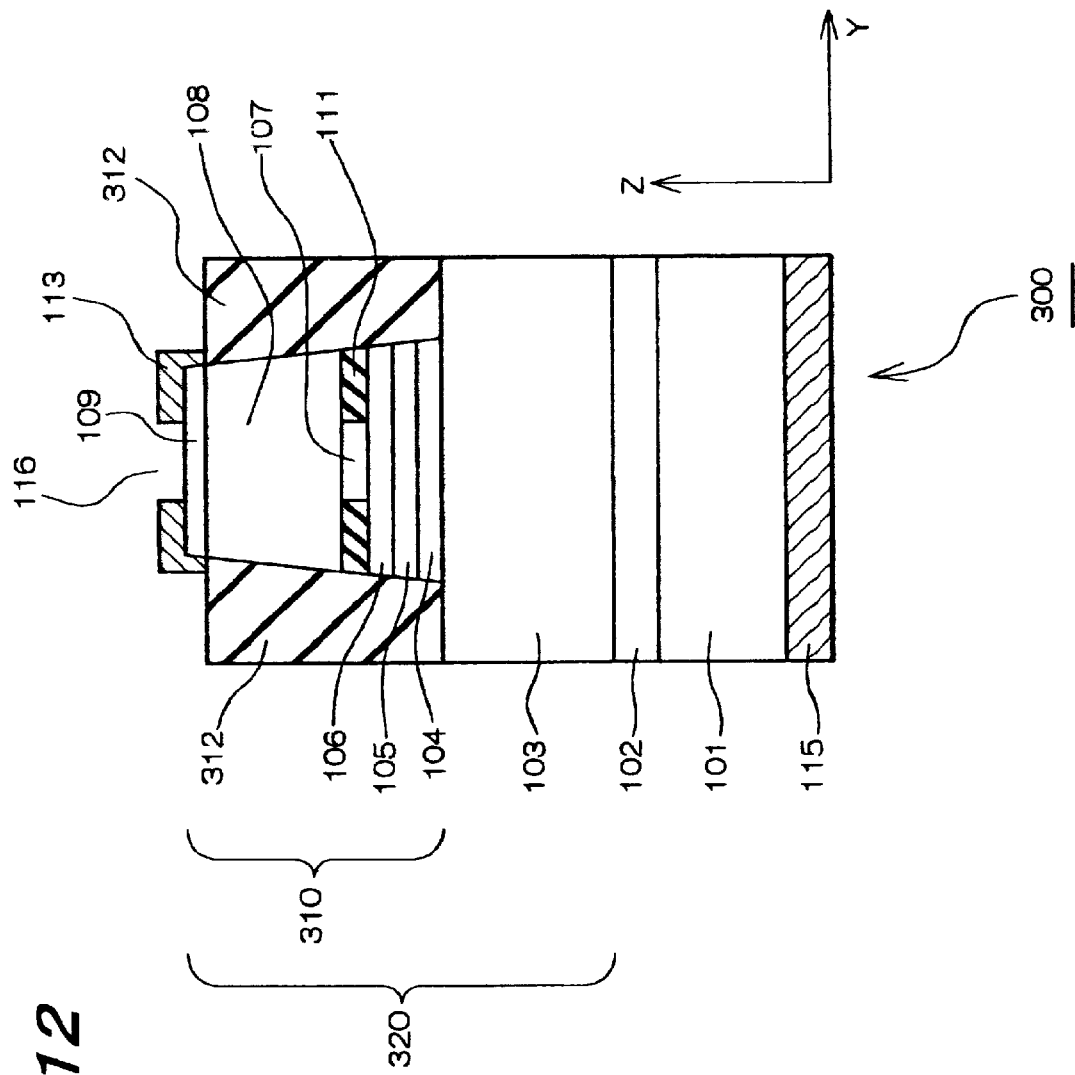
FIG. 12 is a view schematically showing the cross section of the surface emitting semiconductor laser shown in FIG. 10 along the line D—D.

FIG. 10 is a plan view schematically showing a major portion of a surface emitting laser 300 according to a third embodiment of the present invention from the side facing a light emitting aperture. FIG. 11 is a view schematically showing the cross section of the surface emitting laser 300 shown in FIG. 10 along the line C—C. FIG. 12 is a view schematically showing the cross section of the surface emitting laser 300 shown in FIG. 10 along the line D—D.

The structure of the surface emitting laser according to the third embodiment is similar to that of the surface emitting laser 100 according to the first embodiment and that of the surface emitting laser 200 according to the second embodiment. The structure of the surface emitting laser according to the third embodiment is the same as that of the surface emitting laser 100 according to the first embodiment in that the planar configuration of an insulating layer 312 is rectangular. The structure of the surface emitting laser according to the third embodiment is the same as that of the surface emitting laser 200 according to the second embodiment in that the insulating layer 312 is formed by patterning. The difference between the surface emitting laser according to the third embodiment and the surface emitting laser 100 according to the first embodiment and the surface emitting laser 200 according to the second embodiment is as follows. Assuming that the axes intersecting at right angles through the center 330 of the upper side of the columnar portion 110 are respectively the X-axis and Y-axis, the distance Ly3 between the center 330 and the first intersection point between the y-axis and the side of the insulating layer 312, the distance Ly3' between the center 330 and the second intersection point between the y-axis and the side of the insulating layer 312, and the distance Lx3 between the center 330 and the second intersection point between the x-axis and the side of the insulating layer 312 are equal. The columnar portion 310 is formed at a position so that the distance Lx3' between the center 330 and the first intersection point between the x-axis and the side of the insulating layer 312 is greater than the distance Lx3.

2. Device Fabrication Process

The method of fabricating the surface emitting laser 300 according to the third embodiment is essentially the same as that of the surface emitting laser 200 according to the second embodiment, except that the configuration of the insulating layer 312 and the position of the columnar portion 310 with regard to the insulating layer 312 are different. Therefore, further description thereof is omitted.

3. Operation, Action, and Effects of Device

The operation of the surface emitting laser 300 according to the third embodiment is the same as that of the surface emitting lasers according to the first and second embodiments. Therefore, description thereof is omitted.

The action and the effects of the surface emitting laser 300 according to the third embodiment are similar to those of the first embodiment. The surface emitting laser 300 according to the third embodiment further has the following action and effects.

In the surface emitting laser 300 according to the third embodiment, the distances Lx3 and Lx3' are different even though the distances Ly3, Ly3', and Lx3' are equal. Therefore, anisotropic stress including the stresses in the x-axial direction and the y-axial direction in different amounts occurs in the insulating layer 312. Therefore, the anisotropic stress is applied to the active layer 105, whereby the gain of laser light exhibits anisotropy. Because of this, laser light in the specific polarization direction can be preferentially amplified, whereby the polarization direction of laser light can be controlled in a specific direction.

(Fourth Embodiment)

1. Structure and Operation of Device

Figure 13:
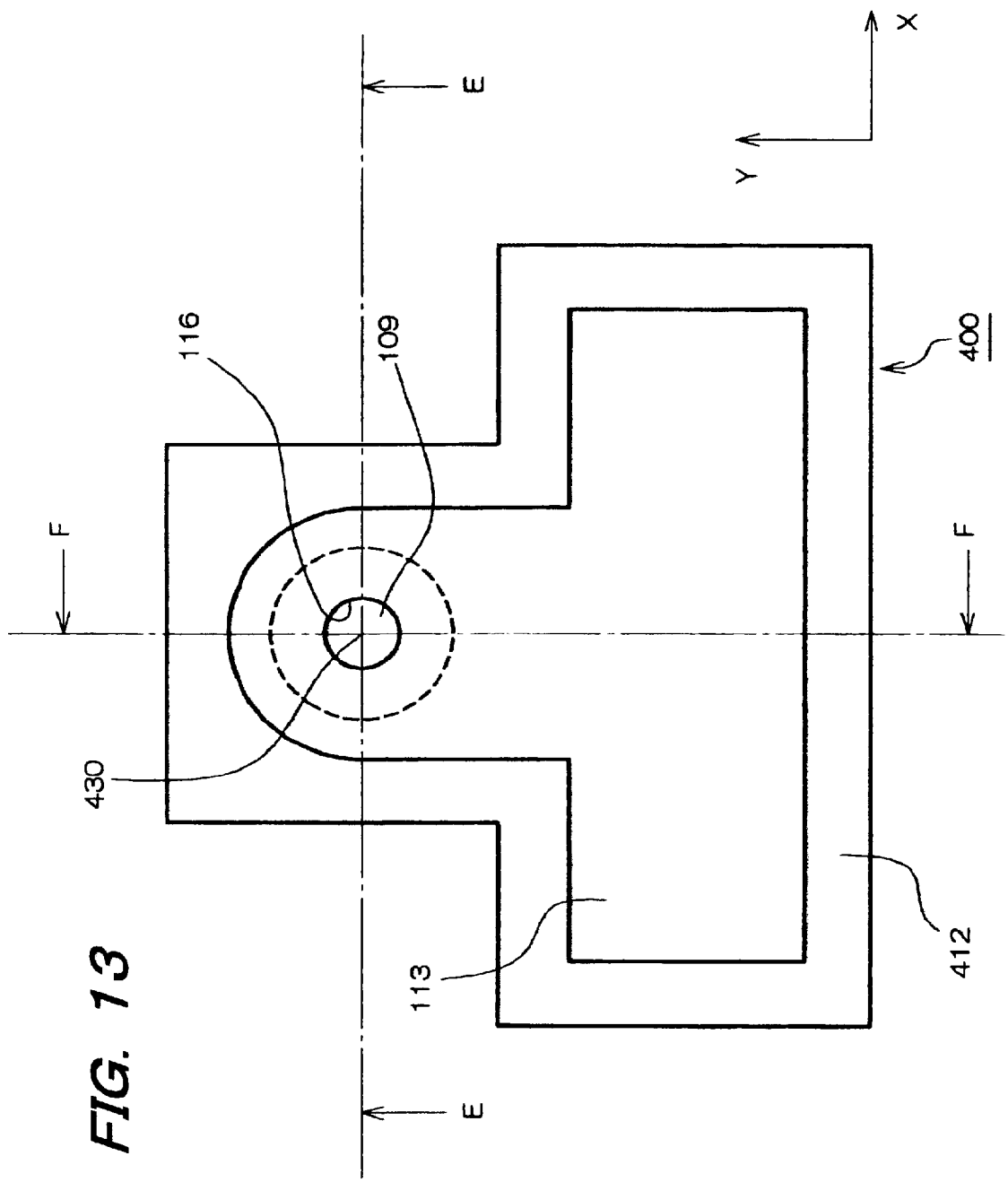
FIG. 13 is a plan view schematically showing a major portion of a surface emitting semiconductor laser according to a fourth embodiment of the present invention.
Figure 14:
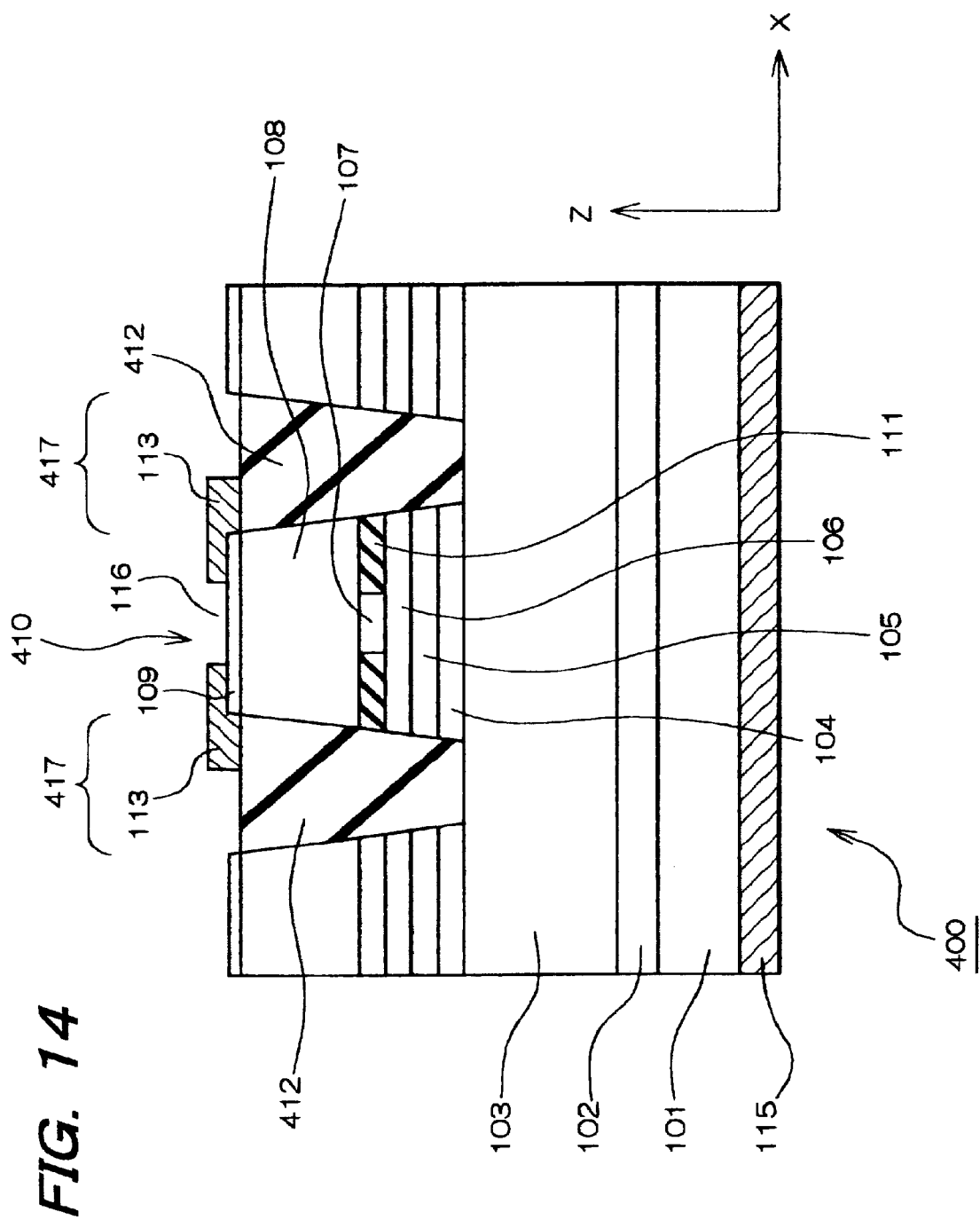
FIG. 14 is a view schematically showing the cross section of the surface emitting semiconductor laser shown in FIG. 13 along the line E—E.
Figure 15:
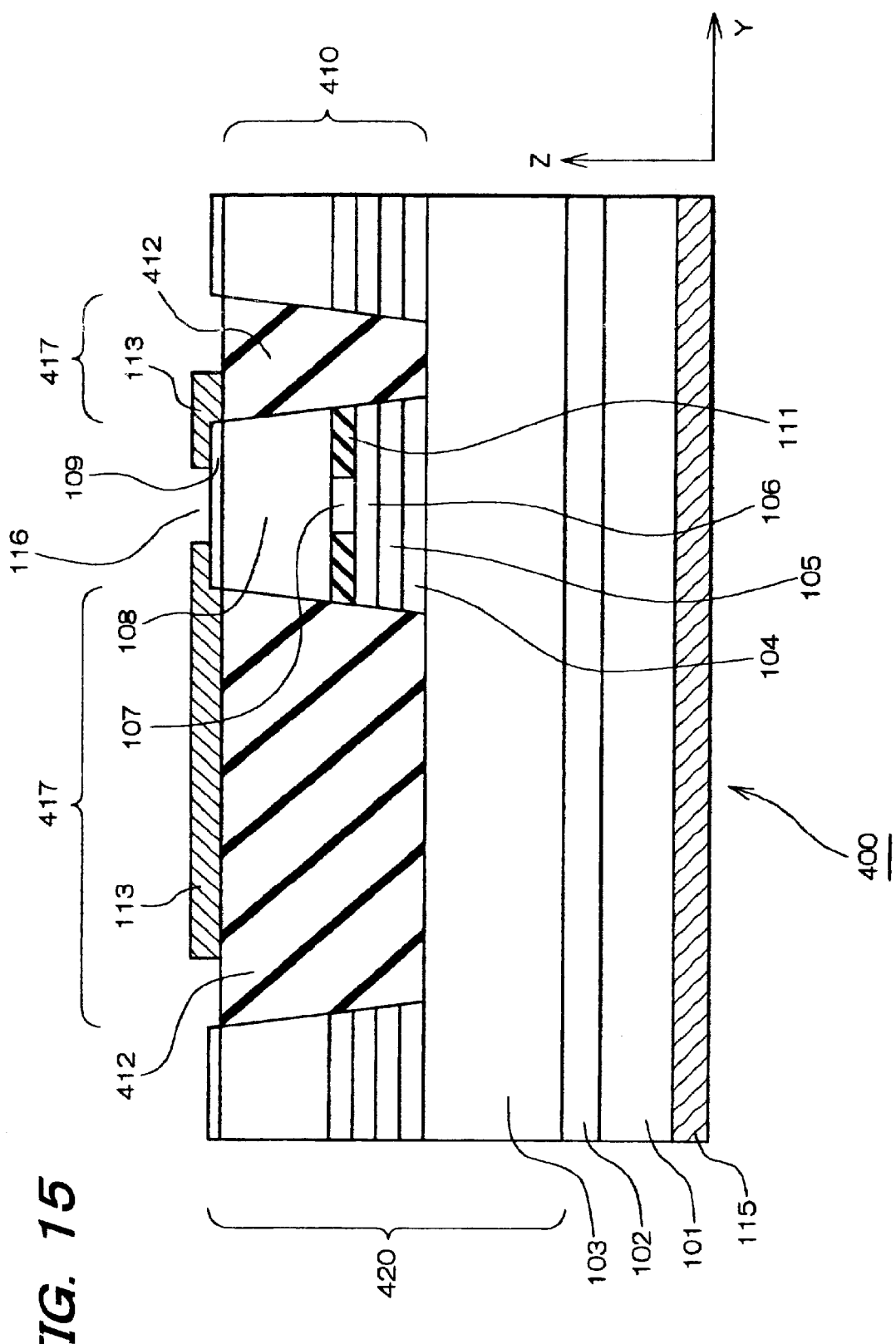
FIG. 15 is a view schematically showing the cross section of the surface emitting semiconductor laser shown in FIG. 13 along the line F—F.

FIG. 13 is a plan view schematically showing a major portion of a surface emitting laser 400 according to a fourth embodiment of the present invention from the side facing a light emitting aperture. FIG. 14 is a view schematically showing the cross section of the surface emitting laser 400 shown in FIG. 13 along the line E—E. FIG. 15 is a view showing the cross section of the surface emitting laser 400 shown in FIG. 13 along the line F—F.

The structure of the surface emitting laser 400 according to the present embodiment is essentially the same as that of the surface emitting laser 100 according to the first embodiment, in which an insulating layer 412 is embedded in a groove 417. In the surface emitting laser 400 according to the present embodiment, the planar configuration of the insulating layer 412 is in the shape of the letter "T", and a columnar portion 410 is formed in the area corresponding to the bottom tip of the letter "T".

2. Device Fabrication Process

The method of fabricating the surface emitting laser 400 according to the fourth embodiment is essentially the same as that of the surface emitting laser 100 according to the first embodiment except that the insulating layer 412 is formed to have a planar configuration in the shape of the letter "T" and the columnar portion 410 is formed in the area corresponding to the bottom tip of the letter "T". Therefore, further description thereof is omitted.

3. Operation, Action, and Effects of Device

The operation of the surface emitting laser 400 according to the present embodiment is the same as that of the surface emitting lasers according to the first to third embodiments. Therefore, description thereof is omitted.

The action and effects of the surface emitting laser according to the fourth embodiment is almost the same as those in the first embodiment. The surface emitting laser 400 according to the fourth embodiment further has the following action and effects.

In the surface emitting laser 400 according to the fourth embodiment, since the columnar portion 410 is formed in the area corresponding to the bottom tip of the letter "T", the upper electrode 113 and the semiconductor layer which does not form the columnar portion 410 can be insulated without forming an insulating layer on the semiconductor layer. Because of this, in the surface emitting laser 400 according to the fourth embodiment, it is unnecessary to form an insulating layer on the semiconductor layer which does not form the columnar portion 410, whereby the device can be simplified and the number of fabrication steps can be reduced.

(Fifth Embodiment)

1. Structure and Operation of Device

Figure 16:
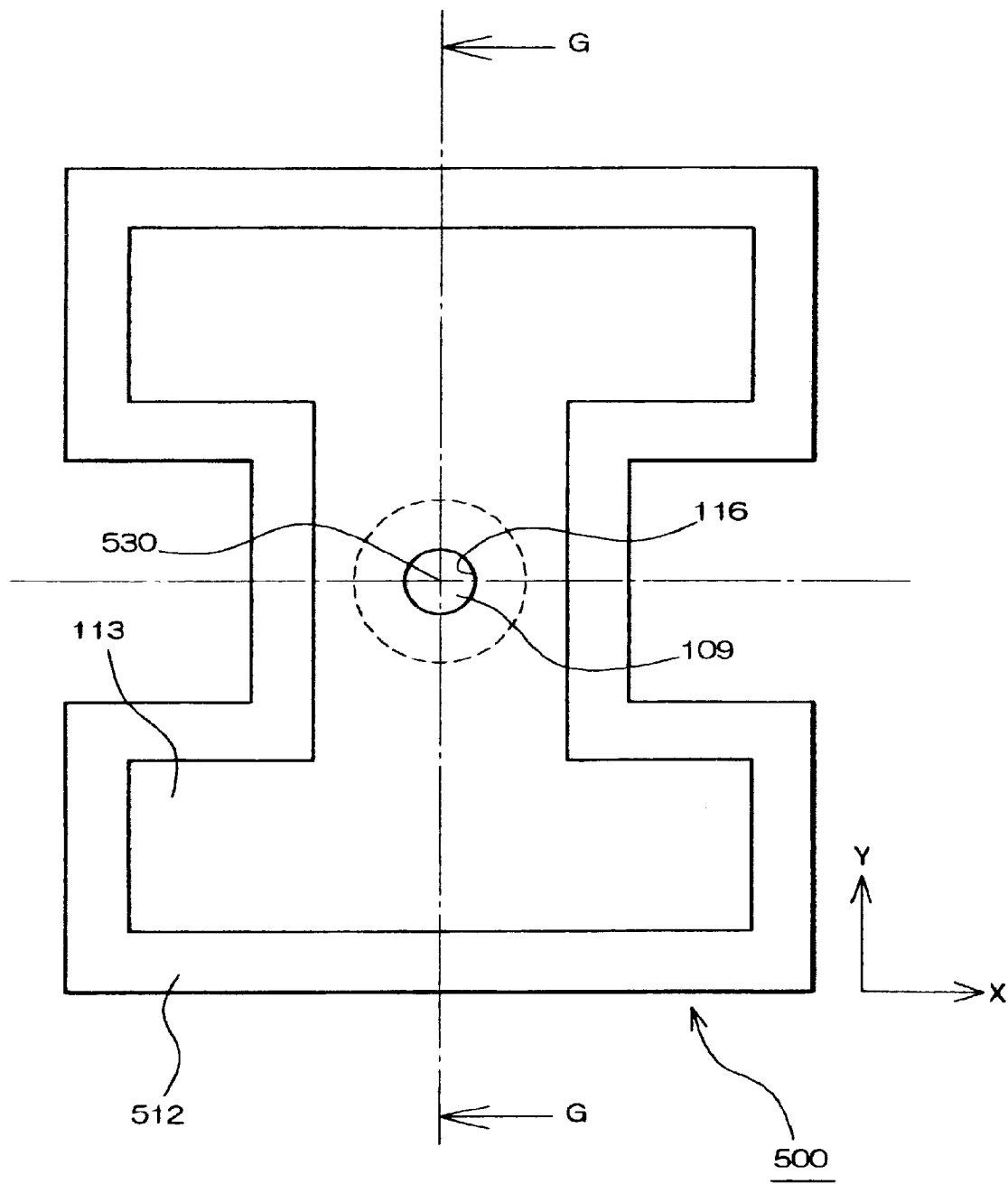
FIG. 16 is a plan view schematically showing a major portion of a surface emitting semiconductor laser according to a fifth embodiment of the present invention.
Figure 17:
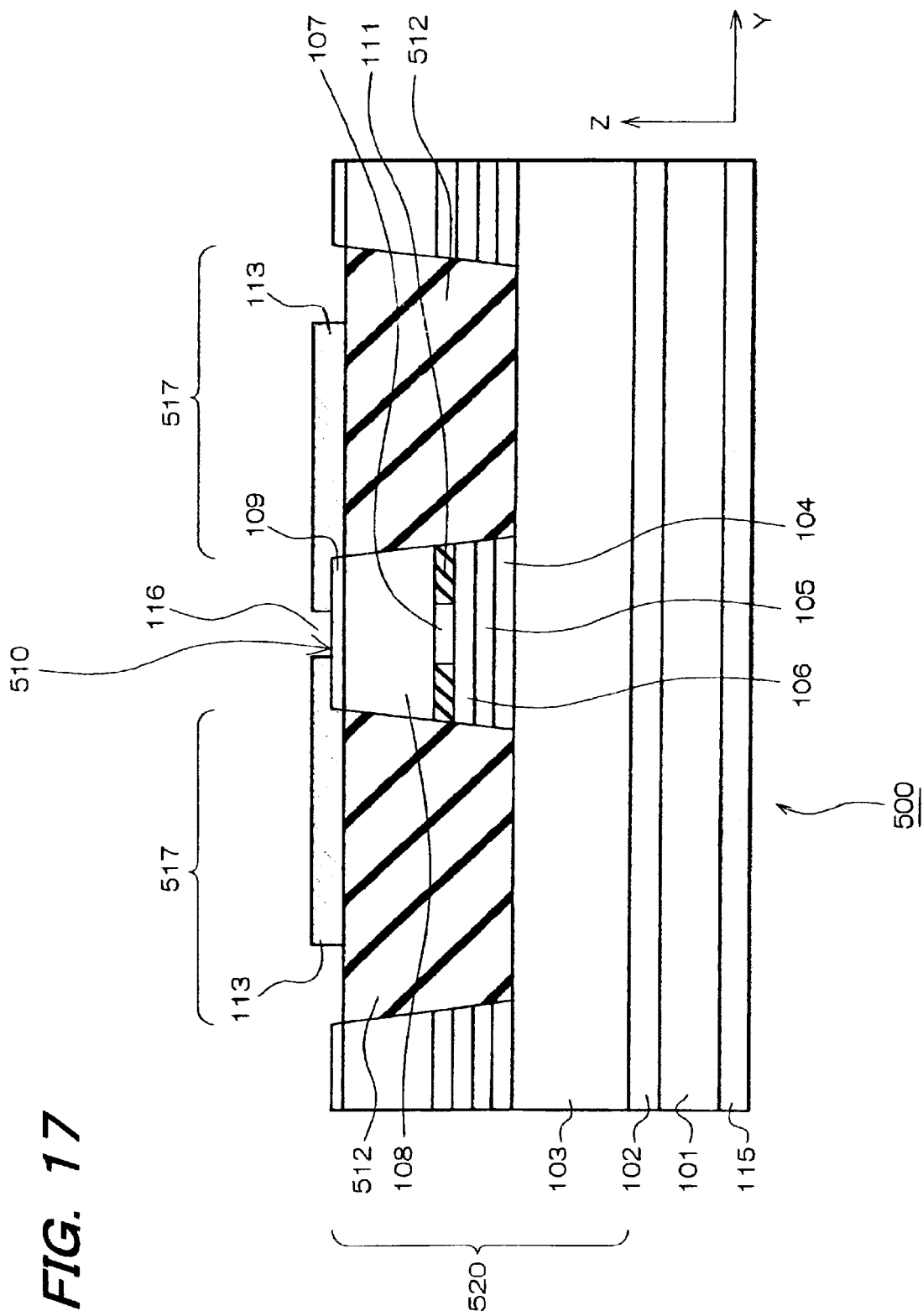
FIG. 17 is a view schematically showing the cross section of the surface emitting semiconductor laser shown in FIG. 16 along the line G—G.

FIG. 16 is a plan view schematically showing a major portion of a surface emitting laser 500 according to a fifth embodiment of the present invention from the side facing a light emitting aperture. FIG. 17 is a view showing the cross section of the surface emitting laser 500 shown in FIG. 16 along the line G—G.

The structure of the surface emitting laser 500 according to the present embodiment is essentially the same as that of the surface emitting laser 100 according to the first embodiment, in which an insulating layer 512 is embedded in a groove 517. The surface emitting laser 500 according to the present embodiment differs from the surface emitting laser 100 according to the first embodiment in that the planar configuration of the insulating layer 512 is two-fold rotationally symmetrical around a columnar portion 510. Specifically, in the surface emitting laser 500, the planar configuration of the insulating layer 512 is in the shape of the letter "H" and the columnar portion 510 is formed in the area corresponding to the center of the cross-bar of the letter 2. Device Fabrication Process The method of fabricating the surface emitting laser 500 according to the fifth embodiment is essentially the same as that of the surface emitting laser 100 according to the first embodiment except that the insulating layer 512 is formed to have a planar configuration in the shape of the letter "H" and the columnar portion 510 is formed in the area corresponding to the center of the cross-bar of the letter "H". Therefore, further description thereof is omitted.

3. Operation, Action, and Effects of Device

The operation of the surface emitting laser 500 according to the present embodiment is the same as that of the surface emitting lasers according to the first to fourth embodiments. Therefore, description thereof is omitted.

The action and the effects of the surface emitting laser 500 according to the fifth embodiment are almost the same as those of the fourth embodiment. The surface emitting laser 500 according to the fifth embodiment further has the following action and effects.

Since the planar configuration of the insulating layer 512 is two-fold rotationally symmetrical around the columnar portion 510, the stress applied to one side of the active layer 105 and the stress applied to the other side of the active layer 105 are equivalent and face 180 degrees in opposite directions. Because of this, assuming that the axes intersecting at right angles through the center 530 are respectively the X-axis and Y-axis, the stresses in the directions parallel to the y-axis are greater than the stresses in the directions parallel to the x-axis, whereby the stresses occuring in the insulating layer 105 can be provided with anisotropy more securely. Therefore, polarization of laser light can be controlled more strictly. In the present embodiment, polarization of laser light can be controlled in the direction parallel to the x-axial direction.

(Sixth Embodiment)

1. Device Structure

Figure 18:
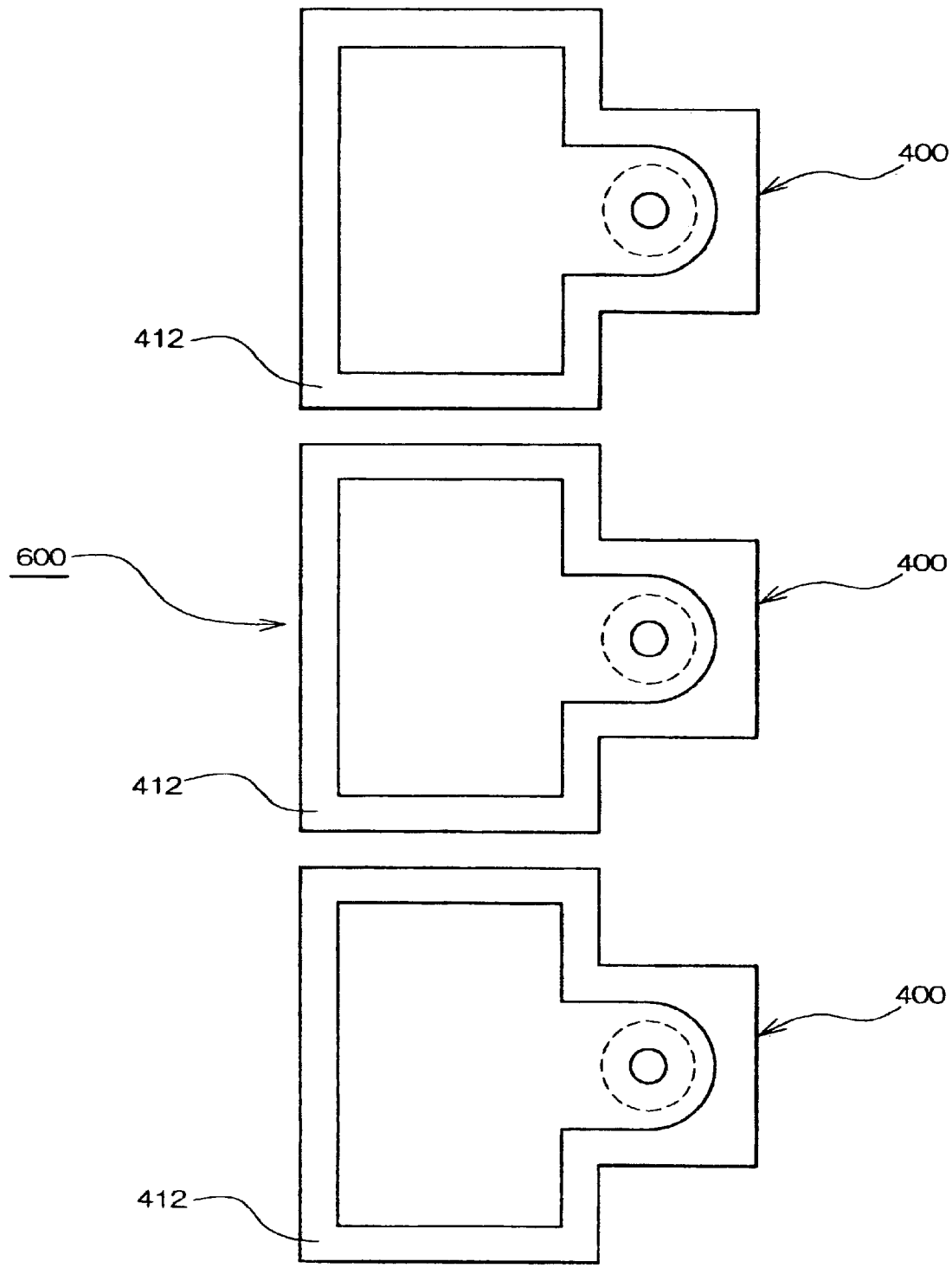
FIG. 18 is a view schematically showing the cross section of a surface emitting semiconductor laser array according to a sixth embodiment of the present invention.

FIG. 18 is a plan view schematically showing a major portion of a surface emitting semiconductor laser array 600 (hereinafter called "surface emitting laser array") according to a sixth embodiment of the present invention from the side facing light emitting apertures.

As shown in FIG. 18, the surface emitting laser array 600 according to the sixth embodiment is formed by arraying a plurality of the surface emitting lasers shown in FIG. 13 according to the fourth embodiment. Grooves (not shown) are formed around the resonators (not shown), and insulating layers 612 are embedded in the grooves in the same manner as in the surface emitting laser 400 according to the fourth embodiment. The adjacent surface emitting lasers 400 are insulated by the insulating layer 612.

2. Device Fabrication Process

The method of fabricating the surface emitting laser array 600 according to the sixth embodiment in which a plurality of the surface emitting lasers 400 are arrayed is essentially the same as that of the surface emitting laser 400 according to the fourth embodiment. Therefore, description thereof is omitted.

3. Operation, Action, and Effects of Device

The operation of the surface emitting laser array 600 according to the sixth embodiment is the same as that of the surface emitting lasers according to the first to fifth embodiments. Therefore, description thereof is omitted.

The action and the effects of the surface emitting laser arrey 600 according to the sixth embodiment are almost the same as those of the fourth embodiment. The surface emitting laser arrey 600 according to the sixth embodiment further has the following effects.

When forming the surface emitting laser array 600, a plurality of the surface emitting lasers 400 can be formed in the same step. Moreover, the surface emitting laser array 600 can be appropriately fabricated according to the application and purpose by forming a predetermined number of surface emitting lasers 400 in a predetermined arrangement.

In the first to sixth embodiments, p-type and n-type in each semiconductor layer may be replaced by n-type and p-type, respectively. Such a modification is within the scope of the present invention. The first to sixth embodiments illustrate the case of using AlGaAs materials. Other materials such as GaInP, ZnSSe, or InGaN semiconductor materials may be used depending on the oscillation wavelength.

The above method of driving the surface emitting lasers is only an example. Various modifications and variations are possible within the scope of the present invention. The above embodiments illustrate a surface emitting laser having one columnar portion. The configuration of the present invention is not impaired even if a plurality of columnar portions is provided on the substrate.

What is claimed is:

1. A surface emitting semiconductor laser comprising:
   a semiconductor substrate; and
   a resonator formed in the perpendicular direction on the semiconductor substrate,
      the resonator comprising a columnar semiconductor deposit and
   an insulating layer formed at a prescribed temperature in contact with the side of the semiconductor deposit, the insulating layer exhibiting anisotropic stress caused by the planar configuration thereof, the prescribed temperature being applied to an entire portion of the insulating layer;
   the surface emitting semiconductor laser emitting laser light in the direction perpendicular to the semiconductor substrate,
   wherein the polarization direction of laser light is controlled by the anisotropic stress.

2. The surface emitting semiconductor laser according to claim 1, wherein the axes intersecting at right angles through the center of the upper side of the semiconductor deposit are respectively the x-axis and y-axis, the anisotropic stress comprises stresses in the x-axial direction and the y-axial direction in different amounts.

3. The surface emitting semiconductor laser according to claim 1, wherein the axes intersecting at right angles through the center of the upper side of the semiconductor deposit are respectively the x-axis and y-axis, the planar configuration of the insulating layer is designed so that the distance between the center and the first intersection point between the x-axis and the side of the insulating layer differs from the distance between the center and the second intersection point between the y-axis and the side of the insulating layer.

4. A surface emitting semiconductor laser comprising:
   a semiconductor substrate; and
   a resonator formed in the perpendicular direction on the semiconductor substrate,
      the resonator comprising a columnar semiconductor deposit and
   an insulating layer formed at a prescribed temperature in contact with the side of the semiconductor deposit, the prescribed temperature being applied to an entire portion of the insulating layer;
   the surface emitting semiconductor laser emitting laser light in the direction perpendicular to the semiconductor substrate,
   wherein the axes intersecting at right angles through the center of the upper side of the semiconductor deposit are respectively the x-axis and y-axis, the planar configuration of the insulating layer is designed so that the distance between the center and the first intersection point between the x-axis and the side of the insulating layer differs from the distance between the center and the second intersection point between the y-axis and the side of the insulating layer.

5. The surface emitting semiconductor laser according to claim 1, wherein the axes intersecting at right angles through the center of the upper side of the semiconductor deposit are respectively the x-axis and y-axis, the planar configuration of the insulating layer is symmetrical with regard to at least either the x-axis or y-axis.

6. The surface emitting semiconductor laser according to claim 1, wherein the planar configuration of the insulating layer is two-fold rotationally symmetrical around the semiconductor deposit.

7. The surface emitting semiconductor laser according to claim 1, wherein the insulating layer is embedded.

8. The surface emitting semiconductor laser according to claim 1, wherein the insulating layer is formed of a polyimide resin, acrylic resin, or epoxy resin.

9. A surface emitting semiconductor laser array formed by arraying a plurality of surface emitting semiconductor lasers according to claim 1.

10. The surface emitting semiconductor laser according to claim 4, wherein the axes intersecting at right angles through the center of the upper side of the semiconductor deposit are respectively the x-axis and y-axis, the planar configuration of the insulating layer is symmetrical with regard to at least either the x-axis or y-axis.

11. The surface emitting semiconductor laser according to claim 4, wherein the planar configuration of the insulating layer is two-fold rotationally symmetrical around the semiconductor deposit.

12. The surface emitting semiconductor laser according to claim 4, wherein the insulating layer is embedded.

13. The surface emitting semiconductor laser according to claim 4, wherein the insulating layer is formed of a polyimide resin, acrylic resin, or epoxy resin.

14. A surface emitting semiconductor laser array formed by arraying a plurality of surface emitting semiconductor lasers according to claim 4.

* * * * *